(12) United States Patent
  Kaneko et al.

(10) Patent No.: US 12,646,687 B2
(45) Date of Patent: Jun. 2, 2026

(54) PLASMA PROCESSING APPARATUS, ANALYSIS APPARATUS, AND STORAGE MEDIUM

(71) Applicant: Tokyo Electron Limited, Tokyo (JP)

(72) Inventors: Kazushi Kaneko, Nirasaki City (JP); Yohei Ishida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 79 days.

(21) Appl. No.: 18/830,640

(22) Filed: Sep. 11, 2024

(65) Prior Publication Data

US 2025/0006464 A1      Jan. 2, 2025

Related U.S. Application Data

(63) Continuation of application No. PCT/JP2023/008220, filed on Mar. 6, 2023.

(30) Foreign Application Priority Data

Mar. 18, 2022    (JP) ................................. 2022-044373

(51) Int. Cl.
   *H01J 37/32*         (2006.01)
(52) U.S. Cl.
   CPC .. *H01J 37/32183* (2013.01); *H01J 37/32146* (2013.01)
(58) Field of Classification Search
   CPC .......... H01J 37/32146; H01J 37/32183; H01L 21/308; H01L 21/67069
   See application file for complete search history.

(56) References Cited

U.S. PATENT DOCUMENTS

2012/0252219 A1* 10/2012 Morimoto ......... H01J 37/32935
                                                          156/345.28

FOREIGN PATENT DOCUMENTS

JP        2019-036482 A        3/2019

OTHER PUBLICATIONS

International Search Report and Written Opinion mailed on May 9, 2023, received for PCT Application PCT/JP2023/008220, filed on Mar. 6, 2023, 08 pages including English Translation.

* cited by examiner

*Primary Examiner* — Jimmy T Vu

(74) *Attorney, Agent, or Firm* — XSENSUS LLP

(57) ABSTRACT

A plasma processing apparatus performs plasma processing in a manner that first and second radio-frequency power supplies generate pulses, respectively, and a matching box controls load-side impedance of the second radio-frequency power supply, and includes: a calculation circuit that acquires power of corresponding reflected wave when the first radio-frequency power supply generates continuous pulse, and the second radio-frequency power supply generates intermittent pulse, based on different set parameters, and calculates an index value indicating the state of reflected wave; and a determination circuit that determines set parameters to be specified in the first and second radio-frequency power supplies, based on variation of each calculated index value, and derives a range to be excluded from a calculation target when the index value to be used for controlling the matcher is calculated.

16 Claims, 24 Drawing Sheets

MATCHING POSITION

PLASMA PROCESSING TIME

MATCHING POSITION

PLASMA PROCESSING TIME

FIG. 9
| MICROWAVE POWER | 1000 W | RADIO-FREQUENCY POWER | 800 W | RADIO-FREQUENCY INTERMITTENT PULSE FREQUENCY | 100 Hz |
|---|---|---|---|---|---|
| MICROWAVE PULSE FREQUENCY | 5 kHz | RADIO-FREQUENCY PULSE FREQUENCY | 5 kHz | RADIO-FREQUENCY INTERMITTENT PULSE DUTY RATIO | 80%, 60% |
| MICROWAVE PULSE DUTY RATIO | 55% | RADIO-FREQUENCY PULSE DUTY RATIO | 15% | OFFSET | 55% |
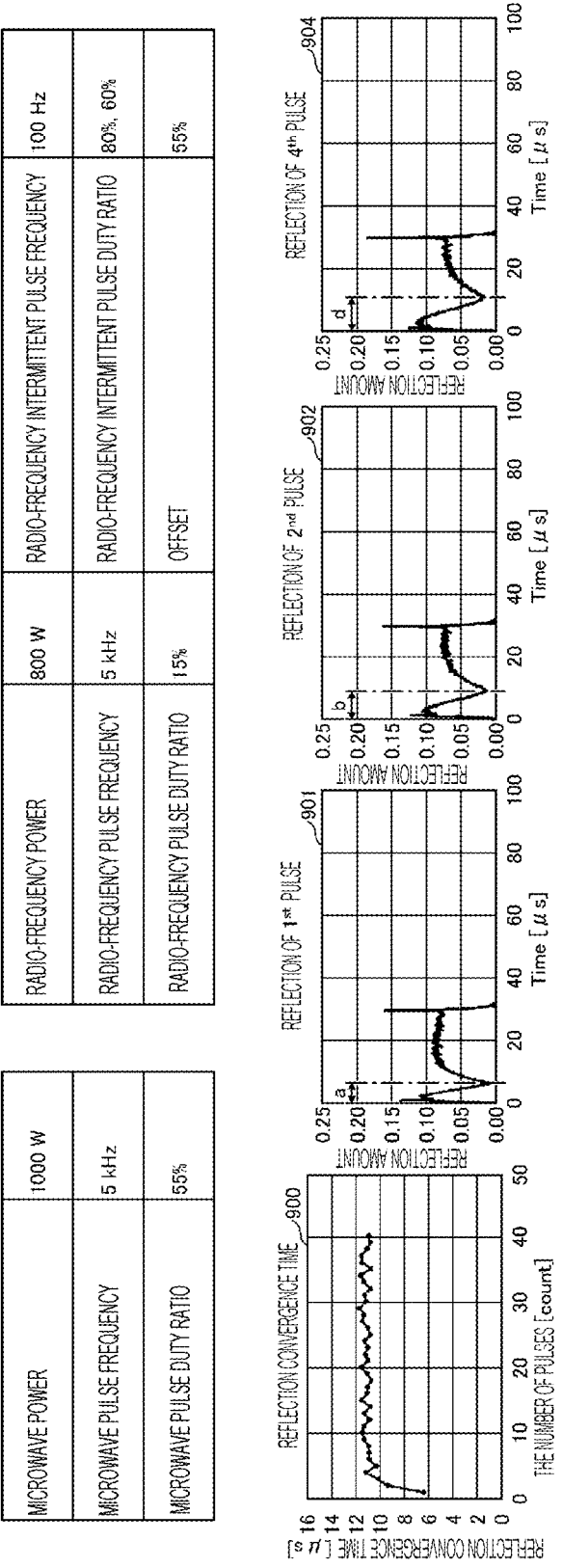
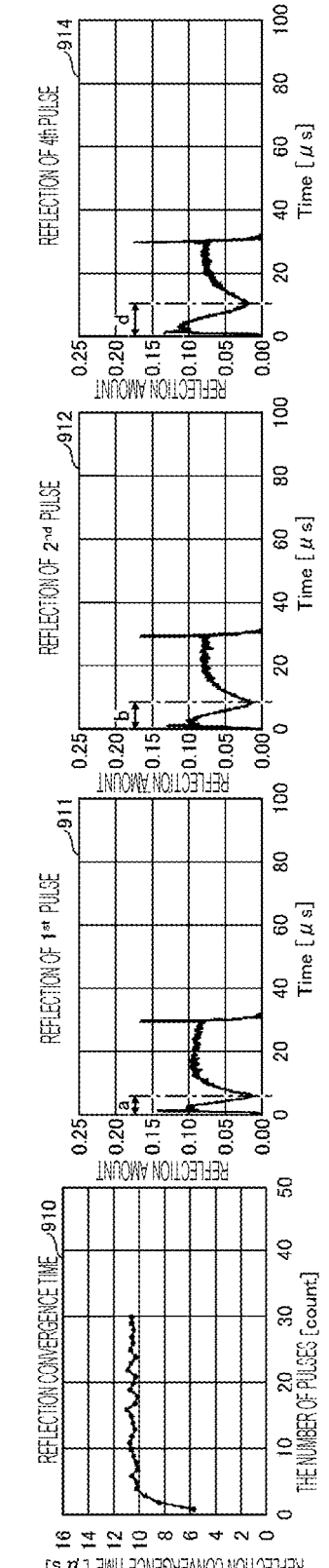

REFLECTION CONVERGENCE TIME [ $\mu$ s]

THE NUMBER OF PULSES [count]

REFLECTION CONVERGENCE TIME [ $\mu$ s]

RADIO-FREQUENCY INTERMITTENT PULSE DUTY RATIO

| PROCESS CONDITIONS | | | | MICROWAVE FOR PLASMA GENERATION | | | RADIO FREQUENCY FOR BIAS | | | | | VARIATION EVALUATION | | |
| PRESSURE | GAS A | GAS B | ... | MICROWAVE POWER | MICROWAVE PULSE FREQUENCY | MICROWAVE PULSE DUTY RATIO | RADIO-FREQUENCY POWER | RADIO-FREQUENCY PULSE DUTY RATIO | OFFSET | RADIO-FREQUENCY INTERMITTENT PULSE FREQUENCY | RADIO-FREQUENCY INTERMITTENT PULSE DUTY RATIO | REFLECTION CONVERGENCE TIME AVERAGE | STANDARD DEVIATION | DETERMINATION RESULT |
|---|---|---|---|---|---|---|---|---|---|---|---|---|---|---|
| Mtorr | sccm | sccm | ... | W | kHz | % | W | % | % | Hz | % | μs | μs | - |
| 100 | 100 | 30 | ... | 1000 | 5 | 90 | - | - | - | - | - | ... | ... | ... |
| | | | | | | 85 | | | | | | ... | ... | ... |
| | | | | | | 80 | | | | | | ... | ... | ... |
| | | | | | | 75 | | | | | | ... | ... | ... |
| | | | | | | 70 | | | | | | ... | ... | ... |
| | | | | | | 65 | | | | | | ... | ... | ... |
| | | | | | | 60 | | | | | | ... | ... | ... |
| | | | | | | 55 | | | | | | ... | ... | ... |
| | | | | | | 50 | | | | | | ... | ... | ... |
| ... | ... | ... | ... | ... | ... | ... | ... | ... | ... | ... | ... | ... | ... | ... |
| 100 | 100 | 30 | | 1000 | 5 | 55 | | | | | | ... | ... | ... |
| | | | | | 7 | | | | | | | ... | ... | ... |
| | | | | | 9 | | | | | | | ... | ... | ... |
| | | | | | 11 | | | | | | | ... | ... | ... |
| | | | | | 13 | | | | | | | ... | ... | ... |
| | | | | | 15 | | | | | | | ... | ... | ... |
| | | | | | 17 | | | | | | | ... | ... | ... |
| | | | | | 19 | | | | | | | ... | ... | ... |
| | | | | | 20 | | | | | | | ... | ... | ... |

| | PROCESS CONDITIONS | | | MICROWAVE FOR PLASMA GENERATION | | | RADIO FREQUENCY FOR BIAS | | | | | VARIATION EVALUATION | | |
|---|---|---|---|---|---|---|---|---|---|---|---|---|---|---|
| | | | | | | | | | | | | REFLECTION CONVERGENCE TIME | | |
| | PRESSURE | GAS A | GAS B | ... | MICROWAVE POWER | MICROWAVE PULSE FREQUENCY | MICROWAVE PULSE DUTY RATIO | RADIO-FREQUENCY POWER | RADIO-FREQUENCY PULSE DUTY RATIO | OFFSET | RADIO-FREQUENCY INTERMITTENT PULSE FREQUENCY | RADIO-FREQUENCY INTERMITTENT PULSE DUTY RATIO | AVERAGE | STANDARD DEVIATION | DETERMINATION RESULT |
| units | Mtorr | sccm | sccm | ... | W | kHz | % | W | % | % | Hz | % | μs | μs | – |
| | 100 | 100 | 30 | ... | 1000 | 5 | 55 | 1000 | 15 | 70 | – | – | ... | ... | – |
| | | | | | | | | 900 | | | | | ... | ... | ... |
| | | | | | | | | 800 | | | | | ... | ... | ... |
| | | | | | | | | 700 | | | | | ... | ... | ... |
| | | | | | | | | 600 | | | | | ... | ... | ... |
| | | | | | | | | 500 | | | | | ... | ... | ... |
| | | | | | | | | 400 | | | | | ... | ... | ... |
| | | | | | | | | 300 | | | | | ... | ... | ... |
| | | | | | | | | 200 | | | | | ... | ... | ... |
| | | | | | | | | 100 | | | | | ... | ... | ... |

FIG. 20

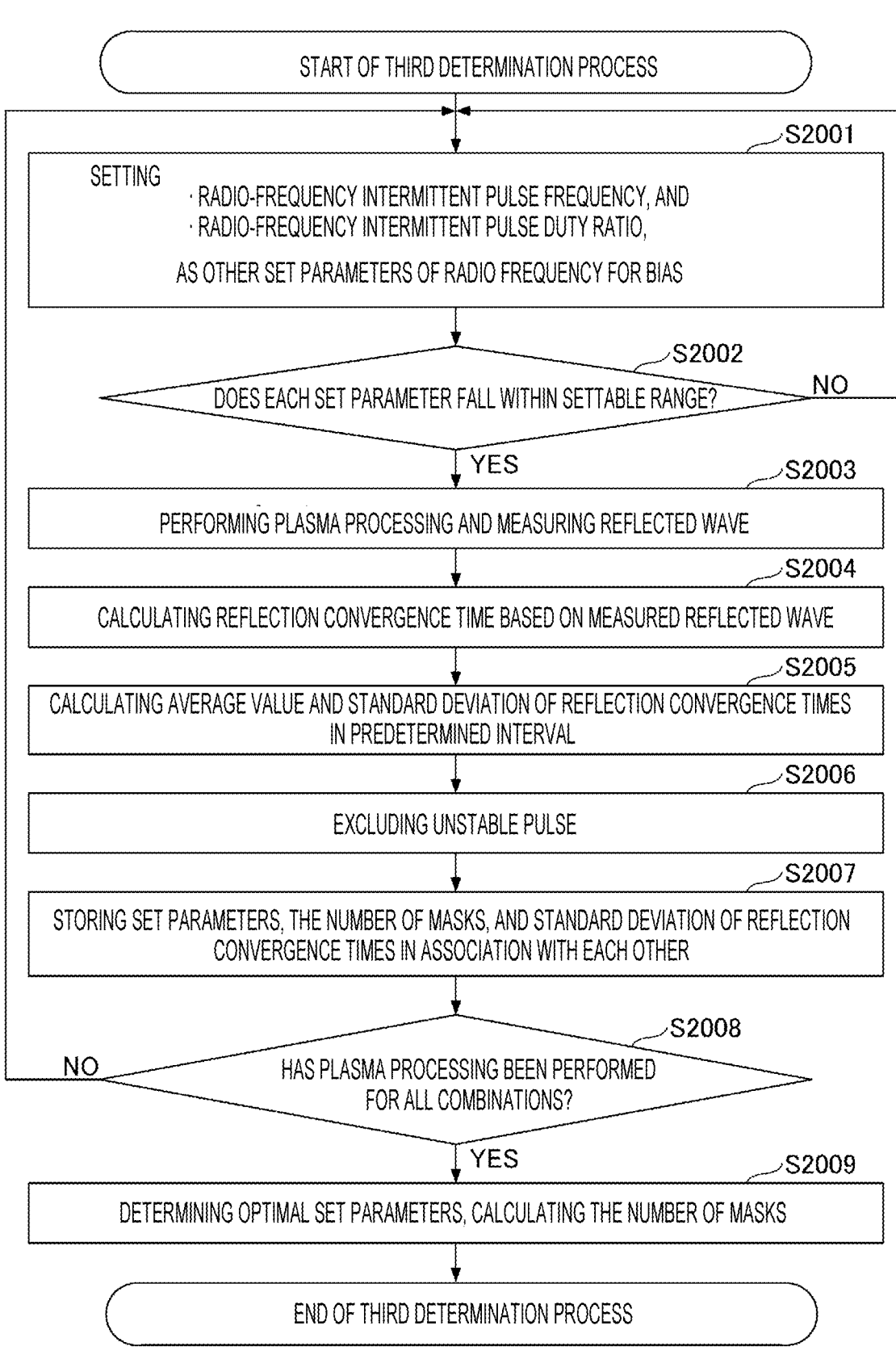

START OF THIRD DETERMINATION PROCESS

S2001

SETTING
· RADIO-FREQUENCY INTERMITTENT PULSE FREQUENCY, AND
· RADIO-FREQUENCY INTERMITTENT PULSE DUTY RATIO,

AS OTHER SET PARAMETERS OF RADIO FREQUENCY FOR BIAS

S2002

DOES EACH SET PARAMETER FALL WITHIN SETTABLE RANGE?　　NO

YES　　S2003

PERFORMING PLASMA PROCESSING AND MEASURING REFLECTED WAVE

S2004

CALCULATING REFLECTION CONVERGENCE TIME BASED ON MEASURED REFLECTED WAVE

S2005

CALCULATING AVERAGE VALUE AND STANDARD DEVIATION OF REFLECTION CONVERGENCE TIMES
IN PREDETERMINED INTERVAL

S2006

EXCLUDING UNSTABLE PULSE

S2007

STORING SET PARAMETERS, THE NUMBER OF MASKS, AND STANDARD DEVIATION OF REFLECTION
CONVERGENCE TIMES IN ASSOCIATION WITH EACH OTHER

S2008

NO　　HAS PLASMA PROCESSING BEEN PERFORMED
FOR ALL COMBINATIONS?

YES　　S2009

DETERMINING OPTIMAL SET PARAMETERS, CALCULATING THE NUMBER OF MASKS

END OF THIRD DETERMINATION PROCESS

| PROCESS CONDITIONS | | | | MICROWAVE FOR PLASMA GENERATION | | | RADIO FREQUENCY FOR BIAS | | | | | NUMBER-OF-MASKS EVALUATION | | |
|---|---|---|---|---|---|---|---|---|---|---|---|---|---|---|
| | | | | | | | | | | | | STANDARD DEVIATION OF REFLECTION CONVERGENCE TIME | | |
| PRESSURE | GAS A | GAS B | ... | MICROWAVE POWER | MICROWAVE PULSE FREQUENCY | MICROWAVE PULSE DUTY RATIO | RADIO-FREQUENCY POWER | RADIO-FREQUENCY PULSE DUTY RATIO | OFFSET | RADIO-FREQUENCY INTERMITTENT PULSE FREQUENCY | RADIO-FREQUENCY INTERMITTENT PULSE DUTY RATIO | NUMBER OF MASKS 0 | NUMBER OF MASKS 1 | ... |
| Mtorr | sccm | sccm | ... | W | kHz | % | W | % | % | Hz | % | $\mu$s | $\mu$s | ... |
| 100 | 100 | 30 | ... | 1000 | 5 | 55 | 800 | 15 | 70 | 100 | 10 | ... | ... | ... |
| | | | | | | | | | | | 20 | ... | ... | ... |
| | | | | | | | | | | | 30 | ... | ... | ... |
| | | | | | | | | | | | 40 | ... | ... | ... |
| | | | | | | | | | | | 50 | ... | ... | ... |
| | | | | | | | | | | | 60 | ... | ... | ... |
| | | | | | | | | | | | 70 | ... | ... | ... |
| | | | | | | | | | | | 80 | ... | ... | ... |
| | | | | | | | | | | | 90 | ... | ... | ... |

PLASMA PROCESSING APPARATUS, ANALYSIS APPARATUS, AND STORAGE MEDIUM

CROSS-REFERENCE TO RELATED APPLICATIONS

This application is a continuation application of International Patent Application No. PCT/JP2023/008220, filed on Mar. 6, 2023, which claims priority from Japanese Patent Application No. 2022-044373, filed on Mar. 18, 2022, with the Japan Patent Office, all of each are incorporated herein in their entireties by reference.

TECHNICAL FIELD

The present disclosure relates to a plasma processing apparatus, an analysis apparatus, and a storage medium.

BACKGROUND

Japanese Patent Laid-Open Publication No. 2019-036482 discloses microwave pulses for plasma generation and radio-frequency pulses for bias in a plasma processing apparatus that processes substrates with plasma.

SUMMARY

According to an aspect of the present disclosure, a plasma processing apparatus has the following configuration. The plasma processing apparatus performs a plasma processing in a manner that a first radio-frequency power supply and a second radio-frequency power supply generate pulses, respectively, and a matching box controls a load-side impedance of the second radio-frequency power supply. The plasma processing apparatus includes: a calculation circuit that acquires a power of a corresponding reflected wave when the first radio-frequency power supply generates a continuous pulse, and the second radio-frequency power supply generates an intermittent pulse, based on different set parameters, and calculates an index value indicating the state of the reflected wave; and a determination circuit that determines set parameters to be specified in the first radio-frequency power supply and the second radio-frequency power supply, based on a variation of each calculated index value, and derives a range to be excluded from a calculation target when the index value to be used for controlling the matcher is calculated.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 9 is a first view illustrating an example of a reflection convergence time when the radio-frequency pulse for bias is driven intermittently.

FIG. 16 is a first view illustrating a specific example of data stored in a data storage unit.

FIG. 19 is a second view illustrating a specific example of data stored in the data storage unit.

FIG. 20 is a flowchart illustrating the flow of a third determination process by the plasma processing apparatus.

FIG. 22 is a third view illustrating a specific example of data stored in the data storage unit.

DETAILED DESCRIPTION

Figure 1:
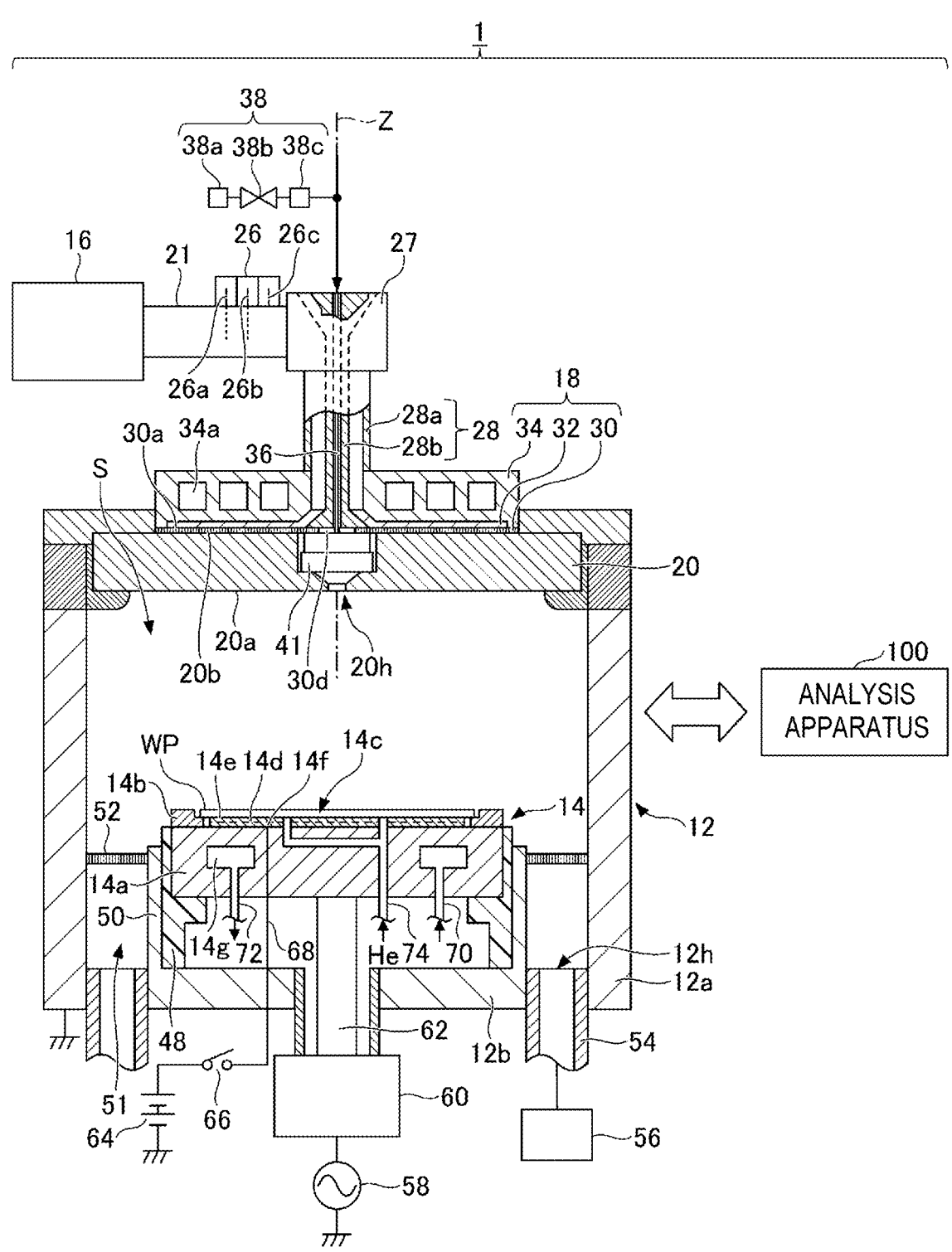
FIG. 1 is a view illustrating an example of a configuration of a plasma processing apparatus.

In the following detailed description, reference is made to the accompanying drawings which form a part hereof. The illustrative embodiments described in the detailed description, drawings, and claims are not meant to be limiting. Other embodiments may be utilized, and other changes may be made without departing from the spirit or scope of the subject matter presented herein.

Hereinafter, embodiments are described with reference to the accompanying drawings. In the descriptions herein and the drawings, components having substantially the same functional configuration are denoted by the same reference numerals, and overlapping descriptions thereof are omitted.

First Embodiment (Configuration of Plasma Processing Apparatus)

First, the configuration of a plasma processing apparatus according to a first embodiment is described. FIG. 1 is a view illustrating an example of the configuration of the plasma processing apparatus. As illustrated in FIG. 1, a plasma processing apparatus 1 for processing a substrate WP with plasma includes a chamber body 12 and a microwave output device 16. Further, the plasma processing apparatus 1 includes a stage 14, an antenna 18, and a dielectric window 20.

The chamber body 12 has a processing space S therein. The chamber body 12 includes a side wall 12a and a bottom 12b. The side wall 12a is formed in the substantially cylindrical shape. The central axis line of the side wall 12a coincides with the axis line Z that extends vertically. The bottom 12b is provided at the lower end of the side wall 12a. In the bottom 12b, an exhaust hole 12h for exhaust is formed. Further, an opening is formed at the upper end of the side wall 12a.

The dielectric window 20 is provided above the upper end of the side wall 12a. The dielectric window 20 includes the lower surface 20a facing the processing space S. The dielectric window 20 closes the opening formed in the upper end of the side wall 12a. An O-ring is interposed between the dielectric window 20 and the upper end of the side wall 12a. With the O-ring, the chamber body 12 may be more securely sealed.

The stage 14 is accommodated in the processing space S. The stage 14 is provided to face the dielectric window 20 in the vertical direction. Further, the stage 14 is provided such that the processing space S is sandwiched between the dielectric window 20 and the stage 14. The stage 14 is configured to support the substrate WP placed thereon.

In the present embodiment, the stage 14 includes a base 14a and an electrostatic chuck 14c. The base 14a has the substantially disk shape, and is formed of a conductive material such as aluminum. The central axis of the base 14a substantially coincides with the axis line Z. The base 14a is supported by a cylindrical support unit 48. The cylindrical support unit 48 is formed of an insulating material, and extends vertically upward from the bottom 12b. A conductive cylindrical support unit 50 is provided around the outer periphery of the cylindrical support unit 48. The cylindrical support unit 50 extends vertically upward from the bottom 12b of the chamber body 12 along the outer periphery of the cylindrical support unit 48. An annular exhaust passage 51 is formed between the cylindrical support unit 50 and the side wall 12a.

A baffle plate 52 is provided in the upper part of the exhaust passage 51. The baffle plate 52 has an annular shape. In the baffle plate 52, a plurality of through holes is formed to penetrate the baffle plate 52 in the plate thickness direction of the baffle plate 52. The exhaust hole 12h described above is formed below the baffle plate 52. An exhaust device 56 is connected to the exhaust hole 12h via an exhaust pipe 54. The exhaust device 56 includes an automatic pressure control valve and a vacuum pump such as a turbo molecular pump. The exhaust device 56 may reduce the pressure of the processing space S to a desired degree of vacuum.

The base 14a also serves as a radio-frequency electrode. A radio-frequency power supply 58 for bias (an example of a second radio-frequency power supply) is electrically connected to the base 14a via a power feeding rod 62 and a matching unit 60. The radio-frequency power supply 58 outputs a specified power of a constant frequency suitable for controlling the energy of ions drawn into the substrate WP, e.g., a radio frequency of 13.56 MHz.

The radio-frequency power supply 58 may include a pulse generator to pulse-modulate the radio-frequency power and apply the pulse-modulated radio-frequency power to the base 14a. In this case, the radio-frequency power supply 58 performs the pulse modulation to make the radio-frequency power, in which a High level power and a Low level power are periodically repeated. The radio-frequency power supply 58 performs a pulse adjustment based on a synchronization signal PSS-R generated by the pulse generator. The synchronization signal PSS-R is a signal that determines the period and the duty ratio of the radio-frequency power. As examples of settings for the pulse modulation, the frequency of the radio-frequency pulse is 10 Hz to 250 kHz, and the duty ratio of the radio-frequency pulse (ratio of the time of the High level power to the pulse period) is 10% to 90%.

The matching unit 60 accommodates a matcher that matches the impedance on the side of the radio-frequency power supply 58 and the impedance on the side of a load, mainly, the electrode, plasma, or the chamber body 12. The matcher includes a blocking capacitor for self-bias generation. The matching unit 60 operates to perform the matching based on the synchronization signal PSS-R, when the radio-frequency power is pulse-modulated.

The electrostatic chuck 14c is provided on the upper surface of the base 14a. The electrostatic chuck 14c holds the substrate WP by an electrostatic adsorption force. The electrostatic chuck 14c includes an electrode 14d, an insulating film 14e, and an insulating film 14f, and has a substantially disk shape. The central axis line of the electrostatic chuck 14c substantially coincides with the axis line Z. The electrode 14d of the electrostatic chuck 14c is configured with a conductive film, and provided between the insulating films 14e and 14f. A DC power supply 64 is electrically connected to the electrode 14d via a switch 66 and a coated wire 68. The electrostatic chuck 14c may adsorb and hold the substrate WP by the Coulomb force generated by a DC voltage applied from the DC power supply 64. Further, a focus ring 14b is provided on the base 14a. The focus ring 14b is disposed to surround the substrate WP and the electrostatic chuck 14c.

A coolant chamber 14g is provided inside the base 14a. For example, the coolant chamber 14g is formed to extend around the axis line Z. A coolant from a chiller unit is supplied to the coolant chamber 14g via a pipe 70. The coolant supplied to the coolant chamber 14g is returned to the chiller unit via a pipe 72. The temperature of the coolant is controlled by the chiller unit, so that the temperature of the electrostatic chuck 14c and the temperature of the substrate WP are controlled.

A gas supply line 74 is formed in the stage 14. The gas supply line 74 supplies a heat transfer gas, for example, He gas, to the space between the upper surface of the electrostatic chuck 14c and the back surface of the substrate WP.

The microwave output device 16 (example of a first radio-frequency power supply) outputs a microwave to excite a processing gas supplied into the chamber body 12 (e.g., for plasma generation). The microwave output device 16 is configured to adjust the frequency, power, and bandwidth of the microwave in a variable manner. The microwave output device 16 may generate, for example, a microwave with a single frequency. Further, the microwave output device 16 may generate a microwave with a bandwidth having a plurality of frequency components therein. The powers of the plurality of frequency components may be the same, or only the median frequency component within the bandwidth may have a larger power than those of the other frequency components.

As an example, the microwave output device 16 may adjust the power of the microwave in the range of 0 W to 5,000 W. Further, the microwave output device 16 may adjust the frequency or median frequency of the microwave in the range of 2,400 MHz to 2,500 MHz, and the bandwidth of the microwave in the range of 0 MHz to 100 MHz. Further, the microwave output device 16 may adjust the frequency pitches (carrier pitches) of the plurality of frequency components of the microwave within the bandwidth in the range of 0 kHz to 25 kHz.

The microwave output device 16 may include a pulse generator to pulse-modulate and output the power of the microwave. In this case, the microwave output device 16 pulse-modulates the microwave to the power, in which a High level power and a Low level power are periodically repeated. The microwave output device 16 performs a pulse adjustment based on a synchronization signal PSS-M generated by the pulse generator. The synchronization signal PSS-M is a signal that determines the period and the duty ratio of the microwave power. As examples of settings for the pulse modulation, the pulse frequency is 1 Hz to 20 kHz, and the pulse duty ratio (ratio of the time of the High level power to the pulse period) is 10% to 90%. The microwave output device 16 may pulse-modulate the power of the microwave to be synchronized with the pulse-modulated radio-frequency power, which is output by the radio-frequency power supply 58. The detailed configuration of the microwave output device 16 is described herein below. Further, specific examples of the microwave pulse for plasma generation, which is output by the microwave output device 16, are described herein below, along with specific examples of the radio-frequency pulse for bias, which is output by the radio-frequency power supply 58.

The plasma processing apparatus 1 further includes a waveguide 21, a tuner 26, a mode converter 27, and a coaxial waveguide 28. The output unit of the microwave output device 16 is connected to one end of the waveguide 21. The other end of the waveguide 21 is connected to the mode converter 27. The waveguide 21 has, for example, a rectangular shape. The waveguide 21 is provided with the tuner 26. The tuner 26 includes stubs 26a, 26b, and 26c. Each of the stubs 26a, 26b, and 26c is configured to adjust a protrusion amount relative to the interior space of the waveguide 21. The tuner 26 adjusts the protrusion position of each of the stubs 26a, 26b, and 26c relative to a reference position, to match the impedance of the microwave output device 16 and the impedance of a load, e.g., the chamber body 12.

The mode converter 27 converts the mode of the microwave from the waveguide 21, and supplies the mode-converted microwave to the coaxial waveguide 28. The coaxial waveguide 28 includes an outer conductor 28a and an inner conductor 28b. The outer conductor 28a has a substantially cylindrical shape, and the central axis line thereof substantially coincides with the axis line Z. The inner conductor 28b has a substantially cylindrical shape, and extends inside the outer conductor 28a. The central axis line of the inner conductor 28b substantially coincides with the axis line Z. The coaxial waveguide 28 transmits the microwave from the mode converter 27 to the antenna 18.

The antenna 18 is provided on the surface 20b of the dielectric window 20, which is opposite to the lower surface 20a of the dielectric window 20. The antenna 18 includes a slot plate 30, a dielectric plate 32, and a cooling jacket 34.

The slot plate 30 is provided on the surface 20b of the dielectric window 20. The slot plate 30 is formed of a conductive metal, and has a substantially disk shape. The central axis line of the slot plate 30 coincides with the axis line Z. A plurality of slot holes 30a is formed in the slot plate 30. Further, a through hole 30d is formed at the center of the slot plate 30, through which a conduit 36 to be described herein below may pass.

The dielectric plate 32 is provided on the slot plate 30. The dielectric plate 32 is formed of a dielectric material such as quartz, and has a substantially disk shape. The central axis line of the dielectric plate 32 substantially coincides with the axis line Z. The cooling jacket 34 is provided on the dielectric plate 32. The dielectric plate 32 is provided between the cooling jacket 34 and the slot plate 30.

The surface of the cooling jacket 34 has the conductive property. A flow path 34a is formed inside the cooling jacket 34. The flow path 34a is configured to be supplied with the coolant. The lower end of the outer conductor 28a is electrically connected to the upper surface of the cooling jacket 34. The lower end of the inner conductor 28b is electrically connected to the slot plate 30 through the cooling jacket 34 and the hole formed at the center of the dielectric plate 32.

The microwave from the coaxial waveguide 28 propagates in the dielectric plate 32, and is supplied to the dielectric window 20 through the plurality of slot holes 30a in the slot plate 30. The microwave supplied to the dielectric window 20 is introduced into the processing space S.

The conduit 36 passes through the inner hole of the inner conductor 28b of the coaxial waveguide 28. As described above, the through hole 30d is formed at the center of the slot plate 30, through which the conduit 36 may pass. The conduit 36 extends through the inner hole of the inner conductor 28b, and is connected to a gas supply system 38.

The gas supply system 38 supplies a processing gas for processing the substrate WP to the conduit 36. The gas supply system 38 includes a gas source 38a, a valve 38b, and a flow controller 38c. The gas source 38a is the gas source of the processing gas. The valve 38b switches the supply of the processing gas from the gas source 38a and the stop of the supply. The flow controller 38c is, for example, a mass flow controller, and adjusts the flow rate of the processing gas from the gas source 38a.

The plasma processing apparatus 1 further includes an injector 41. The injector 41 supplies a gas from the conduit 36 to the through hole 20h formed in the dielectric window 20. The gas supplied to the through hole 20h of the dielectric window 20 is supplied into the processing space S. Then, the gas is excited by the microwave introduced into the processing space S through the dielectric window 20. As a result, plasma is generated in the processing space S, and the substrate WP is processed by active species such as ions and/or radicals from the plasma.

The plasma processing apparatus 1 further includes an analysis apparatus 100. The analysis apparatus 100 comprehensively controls each unit of the plasma processing apparatus 1, and performs an analysis for stabilizing a plasma processing.

The analysis apparatus 100 may be provided as a separate unit from a control device for comprehensively controlling each unit of the plasma processing apparatus 1, inside the plasma processing apparatus 1. In the case where the analysis apparatus 100 is provided as a separate unit from the control device for comprehensively controlling each unit, the analysis apparatus 100 may be provided outside the plasma processing apparatus 1 and be configured to be connected to the plasma processing apparatus 1 via a network. Details of the hardware configuration and the functional configuration of the analysis apparatus 100 are described herein below.

(Details of Configuration of Microwave Output Device)

Figure 2:
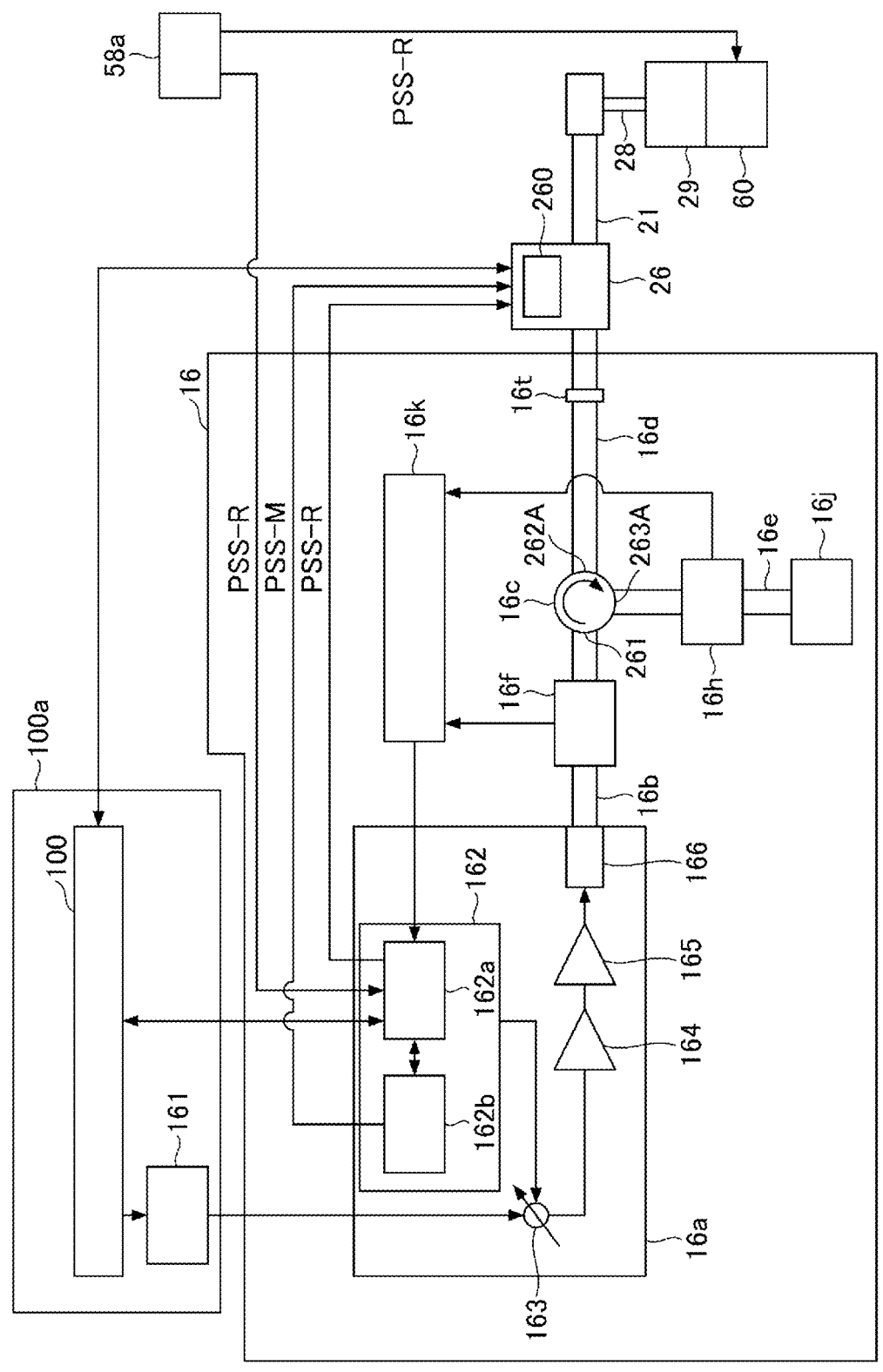
FIG. 2 is a view illustrating an example of a configuration of a microwave output device.

Next, descriptions will be made on the details of the configuration of the microwave output device 16 (including the configuration of devices connected to the microwave output device 16) provided in the plasma processing apparatus 1. FIG. 2 is a view illustrating an example of the configuration of the microwave output device. As illustrated in FIG. 2, the microwave output device 16 is connected to an arithmetic device 100a including the control device 100 and a waveform generator 161.

The waveform generator 161 generates a microwave waveform. The waveform generator 161 generates a microwave waveform with a frequency or median frequency and a bandwidth that correspond to a frequency and a bandwidth specified from the analysis apparatus 100, respectively. The waveform generator 161 outputs the microwave waveform to the microwave output device 16.

The microwave output device 16 pulse-modulates the microwave waveform generated by the waveform generator 161 according to the set parameters specified from the analysis apparatus 100, and outputs the pulse-modulated microwave waveform as a microwave. The microwave output device 16 includes a microwave generation unit 16a, a waveguide 16b, a circulator 16c, a waveguide 16d, a waveguide 16e, a first directional coupler 16f, a second directional coupler 16h, a measurement unit 16k, and a dummy load 16j.

The microwave generation unit 16a generates the microwave pulse-modulated to meet a microwave pulse frequency, a microwave pulse duty ratio, and a microwave of a High level and a Low level that are specified from the analysis apparatus 100.

The microwave generation unit 16a includes a power control unit 162, an attenuator 163, an amplifier 164, an amplifier 165, and a mode converter 166 (corresponding to the mode converter 27 in FIG. 1).

The waveform generation unit 161 is connected to the attenuator 163. The attenuator 163 is, for example, a device that may change an attenuation amount according to an applied voltage value. The power control unit 162 is connected to the attenuator 163. The power control unit 162 controls the attenuation amount of the microwave in the attenuator 163 by using the applied voltage value. The power control unit 162 controls the attenuator 163, such that the microwave output by the waveform generator 161 meets the microwave pulse frequency, the microwave pulse duty ratio, and the microwave power of the High level and the Low level that are specified from the analysis apparatus 100.

The power control unit 162 includes, for example, a control unit 162a and a pulse generator 162b. The control unit 162a acquires set parameters from the analysis apparatus 100. The control unit 162a outputs information necessary for the pulse modulation (microwave pulse frequency and microwave pulse duty ratio) from the set parameters to the pulse generator 162b. The pulse generator 162b generates the synchronization signal PSS-M based on the acquired information. Based on the synchronization signal PSS-M and the set parameters specified by the analysis apparatus 100, the control unit 162a determines the attenuation amount of the microwave.

The control unit 162a may acquire the synchronization signal PSS-R generated from the pulse generator 58a of the radio-frequency power supply 58. The pulse generator 162b may generate the synchronization signal PSS-M synchronized with the synchronization signal PSS-R. In this case, the pulse modulation of the microwave power and the pulse modulation of the radio-frequency power may be synchronized with each other.

The output of the attenuator 163 is connected to the mode converter 166 via the amplifiers 164 and 165. The amplifiers 164 and 165 each amplifies the microwave at a predetermined amplification rate. The mode converter 166 converts the propagation mode of the microwave output from the amplifier 165 from TEM to TE01. The microwave generated by the mode conversion in the mode converter 166 is output as an output microwave of the microwave generation unit 16a.

The output of the microwave generation unit 16a is connected to one end of the waveguide 16b. The other end of the waveguide 16b is connected to a first port 261 of the circulator 16c. The circulator 16c has the first port 261, a second port 262A, and a third port 263A. The circulator 16c is configured to output the microwave input to the first port 261 from the second port 262A, and output the microwave input to the second port 262A from the third port 263A. One end of the waveguide 16d is connected to the second port 262A of the circulator 16c. The other end of the waveguide 16d is an output unit 16t of the microwave output device 16.

One end of the waveguide 16e is connected to the third port 263A of the circulator 16c. The other end of the waveguide 16e is connected to the dummy load 16j. The dummy load 16j receives the microwave propagating through the waveguide 16e, and absorbs the microwave. The dummy load 16j converts the microwave into, for example, heat.

The first directional coupler 16f is provided between one end and the other end of the waveguide 16b. The first directional coupler 16f is configured to split a portion of the microwave output from the microwave generation unit 16a and propagating to the output unit 16t (e.g., a traveling wave), and output the portion of the traveling wave.

The second directional coupler 16h is provided between one end and the other end of the waveguide 16e. For the microwave returned to the output unit 16t (e.g., a reflected wave), the second directional coupler 16h is configured to split a portion of the reflected wave transmitted to the third port 263A of the circulator 16c, and output the portion of the reflected wave.

Based on the portion of the traveling wave output from the first directional coupler 16f, the measurement unit 16k determines a first High measurement value Pf(H) and a first Low measurement value Pf(L) that indicate the High level and the Low level of the power of the traveling wave in the output unit 16t, respectively. Further, based on the portion of the reflected wave output from the second directional coupler 16h, the measurement unit 16k determines a second High measurement value Pr(H) and a second Low measurement value Pf(L) that indicate the High level and the Low level of the power of the reflected wave in the output unit 16t, respectively.

The measurement unit 16k is connected to the power control unit 162. The measurement unit 16k outputs the measurement values to the power control unit 162. The power control unit 162 controls the attenuator 163 such that the difference between the measurement values of the traveling wave and the reflected wave, e.g., a load power (effective power) matches the set parameters specified by the analysis apparatus 100 (microwave power).

The tuner 26 includes a tuner control unit 260. The tuner control unit 260 adjusts the protrusion positions of the stubs 26a, 26b, and 26c to match the impedance on the side of the microwave output device 16 and the impedance on the side of the antenna 18 with each other, based on signals from the analysis apparatus 100. The tuner control unit 260 operates the stubs 26a, 26b, and 26c by using driver circuits and actuators (not illustrated).

The tuner control unit 260 may acquire at least one of the synchronization signal PSS-M for the microwave power, which is generated by the pulse generator 162b, and the synchronization signal PSS-R for the radio-frequency power, which is generated by the pulse generator 58a of the radio-frequency power supply 58. For example, the tuner control unit 260 acquires the synchronization signal PSS-M from the control unit 162a. The tuner control unit 260 may acquire the synchronization signal PSS-R from the control unit 162a or directly from the pulse generator 58a of the radio-frequency power supply 58. The tuner control unit 260 may operate the stubs 26a, 26b, and 26c in consideration of the synchronization signals.

(Detailed Configuration of Matching Circuit of Matching Unit>

Figure 3:
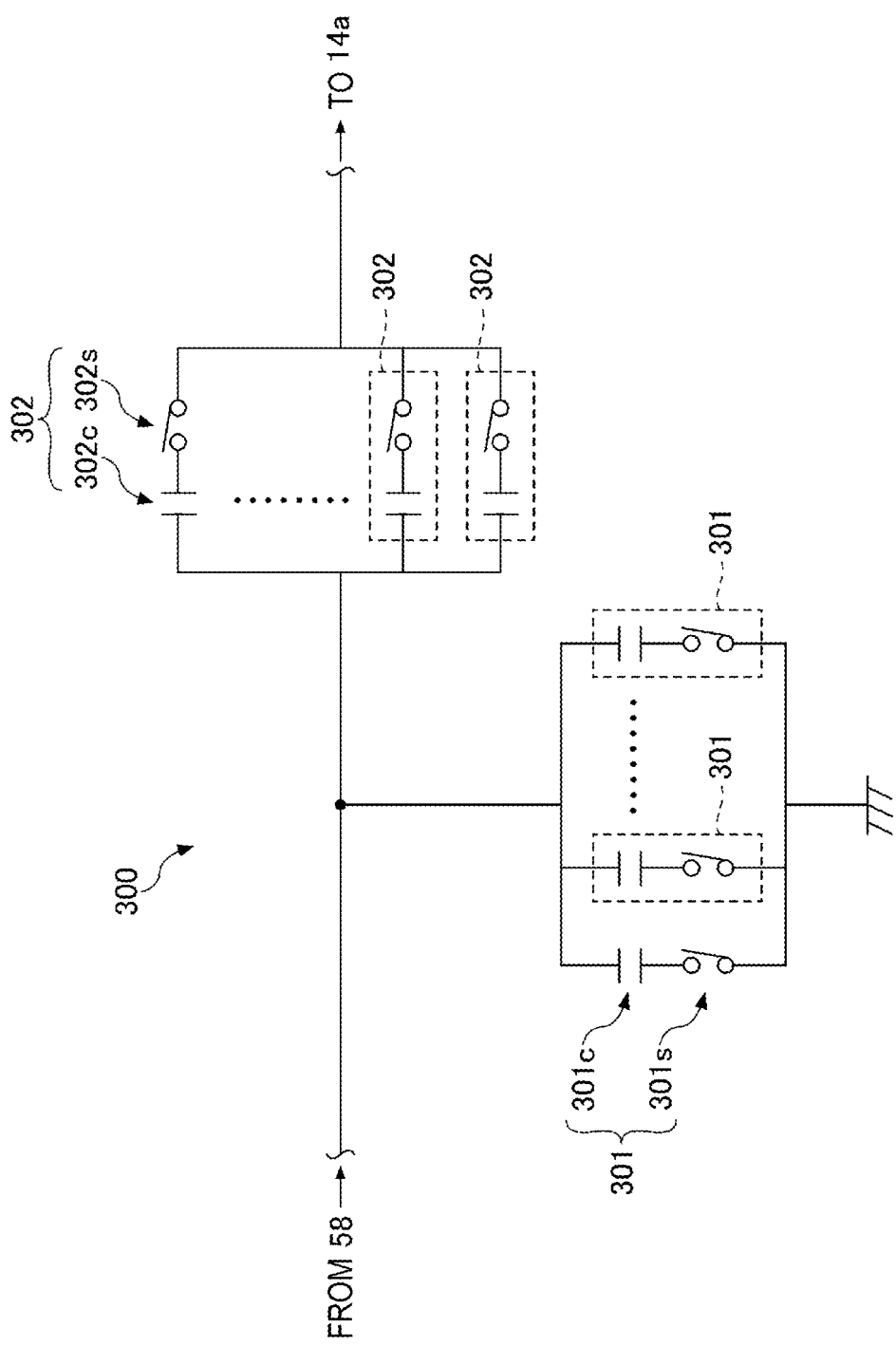
FIG. 3 is a view illustrating an example of a matching circuit of a matcher.

Next, the detailed configuration of the matching circuit of the matcher provided in the matching unit 60 is described. FIG. 3 is a view illustrating an example of the matching circuit of the matcher. As illustrated in FIG. 3, the matching circuit 300 is an electronically controlled matching circuit, and includes a plurality of series circuits 301 and a plurality of series circuits 302.

The plurality of series circuits 301 are connected in parallel to each other. In the example illustrated in FIG. 3, the plurality of series circuits 301 are connected in parallel between nodes disposed between the radio-frequency power supply 58 and the electrode on the side of the load (e.g., the base 14a serving as a radio-frequency electrode) and the ground. Each of the plurality of series circuits 301 includes a capacitor 301c and a switching element 301s. The capacitor 301c and the switching element 301s are connected in series to each other. The switching element 301s is, for example, a PIN diode.

The plurality of series circuits 302 are connected in parallel to each other. In the example illustrated in FIG. 3, the plurality of series circuits 302 are connected in parallel between the radio-frequency power supply 58 and the electrode on the side of the load (e.g., the base 14a serving as a radio-frequency electrode). In another example, the plurality of series circuits 302 may be connected in parallel between other nodes disposed between the radio-frequency power supply 58 and the electrode on the side of the load (e.g., the base 14a serving as a radio-frequency electrode) and the ground. Each of the plurality of series circuits 302 includes a capacitor 302c and a switching element 302s. The capacitor 302c and the switching element 302s are connected in series to each other. The switching element 302s is, for example, a PIN diode. The matching circuit 300 may further include, for example, an inductor.

The plurality of switching elements 301s and the plurality of switching elements 302s in the matching circuit 300 are controlled such that the load-side impedance of the radio-frequency power supply 58 becomes close to the output impedance of the radio-frequency power supply 58. In the present embodiment, the load-side impedance of the radio-frequency power supply 58 is obtained by the analysis apparatus 100 based on a reflection convergence time to be described herein below. Then, the analysis apparatus 100 controls the matching circuit 300 such that the obtained load-side impedance of the radio-frequency power supply 58 becomes close to the output impedance of the radio-frequency power supply 58.

(Hardware Configuration of Analysis Apparatus)

Figure 4:
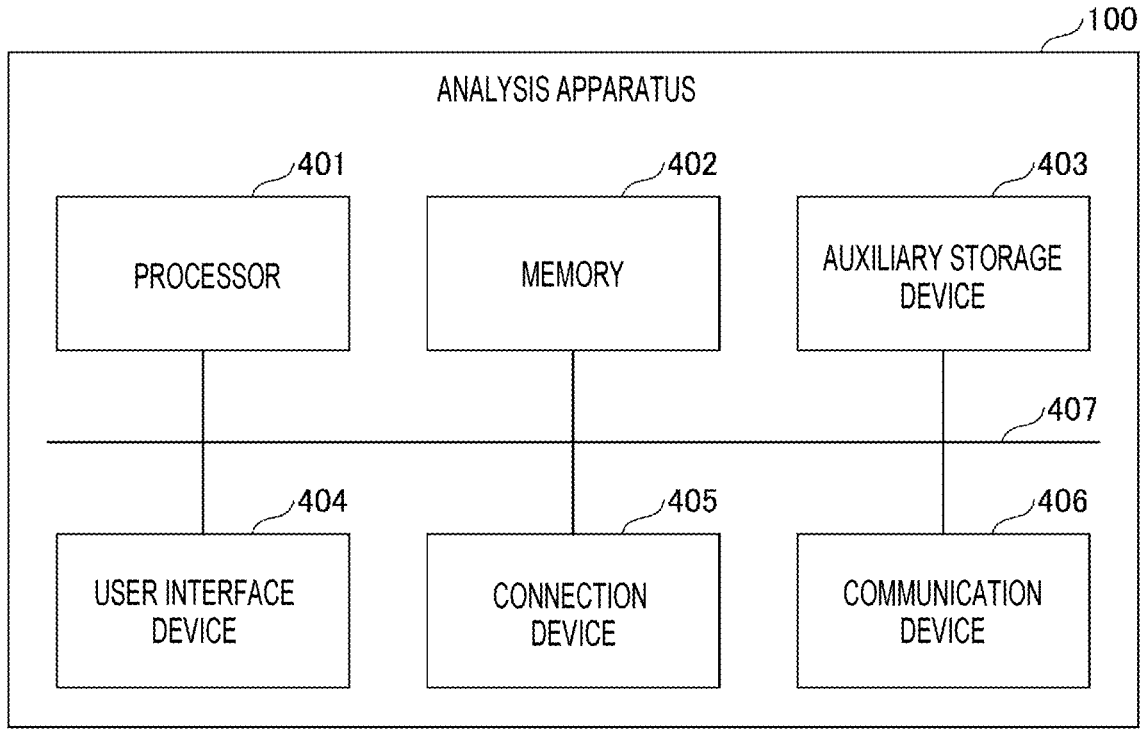
FIG. 4 is a view illustrating an example of a hardware configuration of an analysis apparatus.

Next, the hardware configuration of the analysis apparatus 100 that makes up the plasma processing apparatus 1 is described. FIG. 4 is a view illustrating an example of the hardware configuration of the analysis apparatus. As illustrated in FIG. 4, the analysis apparatus 100 includes a processor 401, a memory 402, an auxiliary storage device 403, a user interface device 404, a connection device 405, and a communication device 406. The respective hardware components of the analysis apparatus 100 are connected to each other via a bus 407.

The processor 401 includes various arithmetic devices such as a central processing unit (CPU) and a graphics processing unit (GPU). The processor 401 reads and executes various programs (e.g., an analysis program according to the present embodiment, as well as a program for comprehensively controlling each unit of the plasma processing apparatus 1) on the memory 402.

The memory 402 includes main storage devices such as a read only memory (ROM) and a random access memory (RAM). The processor 401 and the memory 402 form a so-called computer, and the processor 401 executes the various programs read on the memory 402 to implement various functions of the computer.

The auxiliary storage device 403 stores various programs, or various data used when the various programs are executed by the processor 401.

The user interface device 404 includes, for example, a keyboard or a touch panel, with which a process manager performs, for example, an input operation of commands in order to manage the plasma processing apparatus 1, and a display that visually displays, for example, an operation status of the plasma processing apparatus 1.

The connection device 405 is a connection device that is connected to each unit of the plasma processing apparatus 1. The communication device 406 is a communication device for communicating with an external device (not illustrated) through a network.

(Microwave Pulse for Plasma Generation and Radio-Frequency Pulse for Bias)

Figure 5:
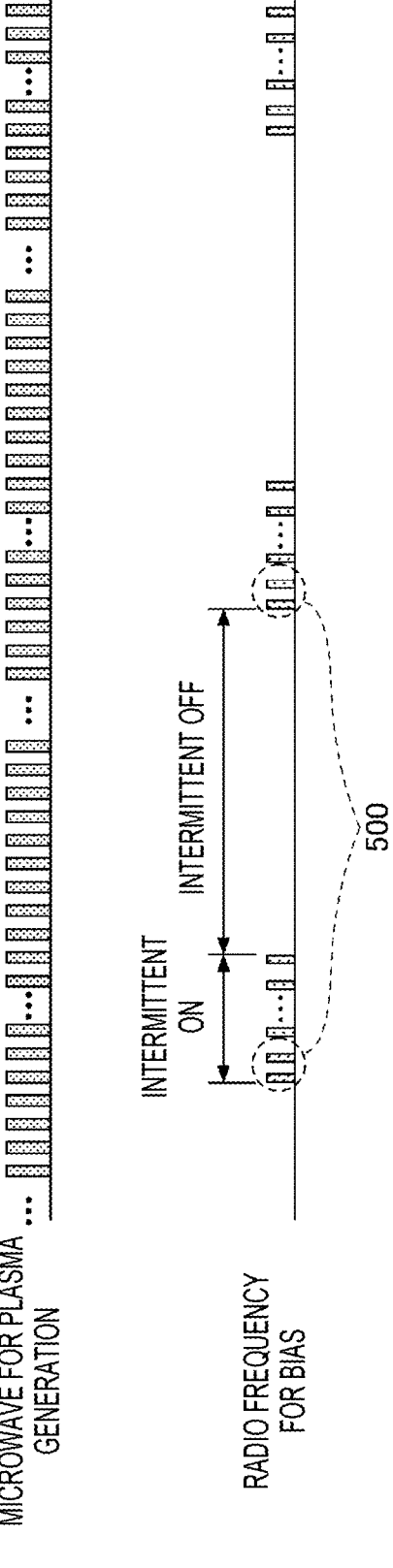
FIG. 5 is a view illustrating examples of a microwave pulse for plasma generation and a radio-frequency pulse for bias.

Next, specific examples of a microwave pulse for plasma generation and a radio-frequency pulse for bias are described with reference to FIG. 5. FIG. 5 is a first view illustrating an example of the microwave pulse for plasma generation and the radio-frequency pulse for bias.

In FIG. 5, the upper part represents a microwave pulse when the power of the microwave is pulse-modulated, and the lower part represents a radio-frequency pulse when the power of the radio frequency is pulse-modulated.

As illustrated in the example of the upper part of FIG. 5, in the present embodiment, the microwave pulse for plasma generation is output as a continuous pulse. Meanwhile, as illustrated in the example of the lower part of FIG. 5, in the present embodiment, the radio-frequency pulse for bias is output as an intermittent pulse, and includes an intermittent ON time and an intermittent OFF time. In this way, the microwave pulse for plasma generation is driven continuously, and the radio-frequency power for bias is driven intermittently, so that the plasma processing apparatus 1 may perform an etching during the intermittent ON time and perform an exhaust of by-products during the intermittent OFF time. As a result, according to the plasma processing apparatus 1, the etching profile including, for example, the selectivity, CD, and residues may be improved.

Meanwhile, when the radio frequency for bias is driven intermittently, there may be a case where the reflection convergence time of the reflected wave is not stable for the pulses immediately after the transition from the intermittent OFF time to the intermittent ON time (see, e.g., the reference numeral 500).

As described above, in this case, when the matching circuit 300 attempts to control the load-side impedance of the radio-frequency power supply 58, which is obtained based on the reflection convergence time, to be close to the output impedance of the radio-frequency power supply 58, for example, the following event may occur:

a matching position is obtained as different values among substrates (binarization), or the matching position varies during a plasma processing in the same substrate (occurrence of fluctuation).

Further, the fact that the load-side impedance of the radio-frequency power supply 58 is not stable is equivalent to the fact that the plasma processing is not stable. Therefore, the analysis apparatus 100 according to the present embodiment searches for and determines set parameters of the microwave pulse for plasma generation, and set parameters of the radio-frequency pulse for bias, for each process condition, in order to make the variation of the reflection convergence time equal to or less than a predetermined threshold value. Further, the analysis apparatus 100 according to the present embodiment searches for and determines the number of masks, in order to stabilize the reflection convergence time when the microwave for plasma generation is driven continuously, and the radio-frequency pulse for bias is driven intermittently, based on the determined set parameters. Here, the number of masks refers to a pulse range to be excluded from calculation targets when calculating the reflection convergence time used to control the matching circuit 300 (the range to be excluded from calculation targets of the reflection convergence time among a plurality of pulses included in the intermittent pulse).

In this way, the set parameters and the number of masks are optimized, so that the analysis apparatus 100 according to the present embodiment may stabilize the reflection convergence time used to control the matcher, and avoid the binarization of the matching position, and the occurrence of fluctuation.

As a result, according to the analysis apparatus 100 of the present embodiment, the plasma processing by the plasma processing apparatus 1 may be stabilized.

(Specific Examples of Matching Position)

Figure 6A:
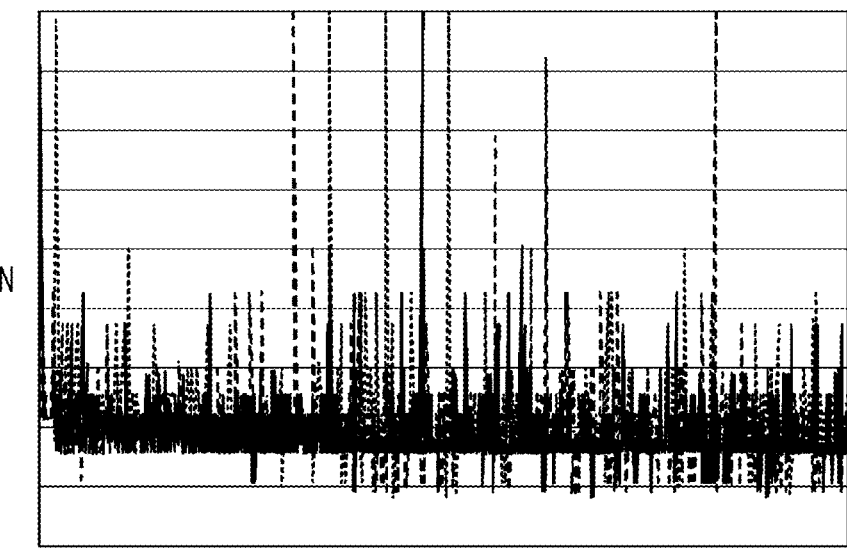
FIGS. 6A and 6B are views illustrating a specific example of a matching position when the radio-frequency pulse for bias is driven intermittently.
Figure 6B:
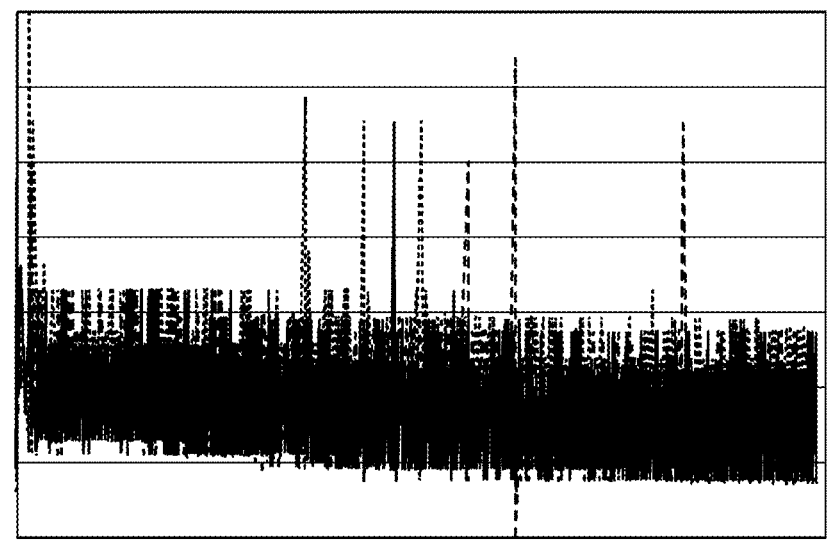

Next, the binarization and the fluctuation that may occur when the radio-frequency pulse for bias is driven intermittently are described in detail. FIGS. 6A and 6B are views illustrating specific examples of the matching position when the radio-frequency pulse for bias is driven intermittently. In FIGS. 6A and 6B, the horizontal axis represents the elapsed time of a plasma processing, and the vertical axis represents the matching position of the capacitor of the matching circuit 300. FIG. 6A represents the matching position of the capacitor 301c in the matching circuit 300, and FIG. 6B represents the matching position of the capacitor 302c in the matching circuit 300. In the figures, the different types of lines indicate that the plasma processing is performed on a plurality of substrates.

As clear from FIGS. 6A and 6B, it may be seen that the fluctuation occurs in both the capacitors 301c and 302c. The examples of FIGS. 6A and 6B represent the case where the matching circuit 300, which is an electronically controlled matching circuit, is used. However, in the case of a low-speed matching circuit using a vacuum capacitor, the binarization may occur, in which the matching position is obtained as different values among substrates (not illustrated).

(Set Parameters)

Figure 7:
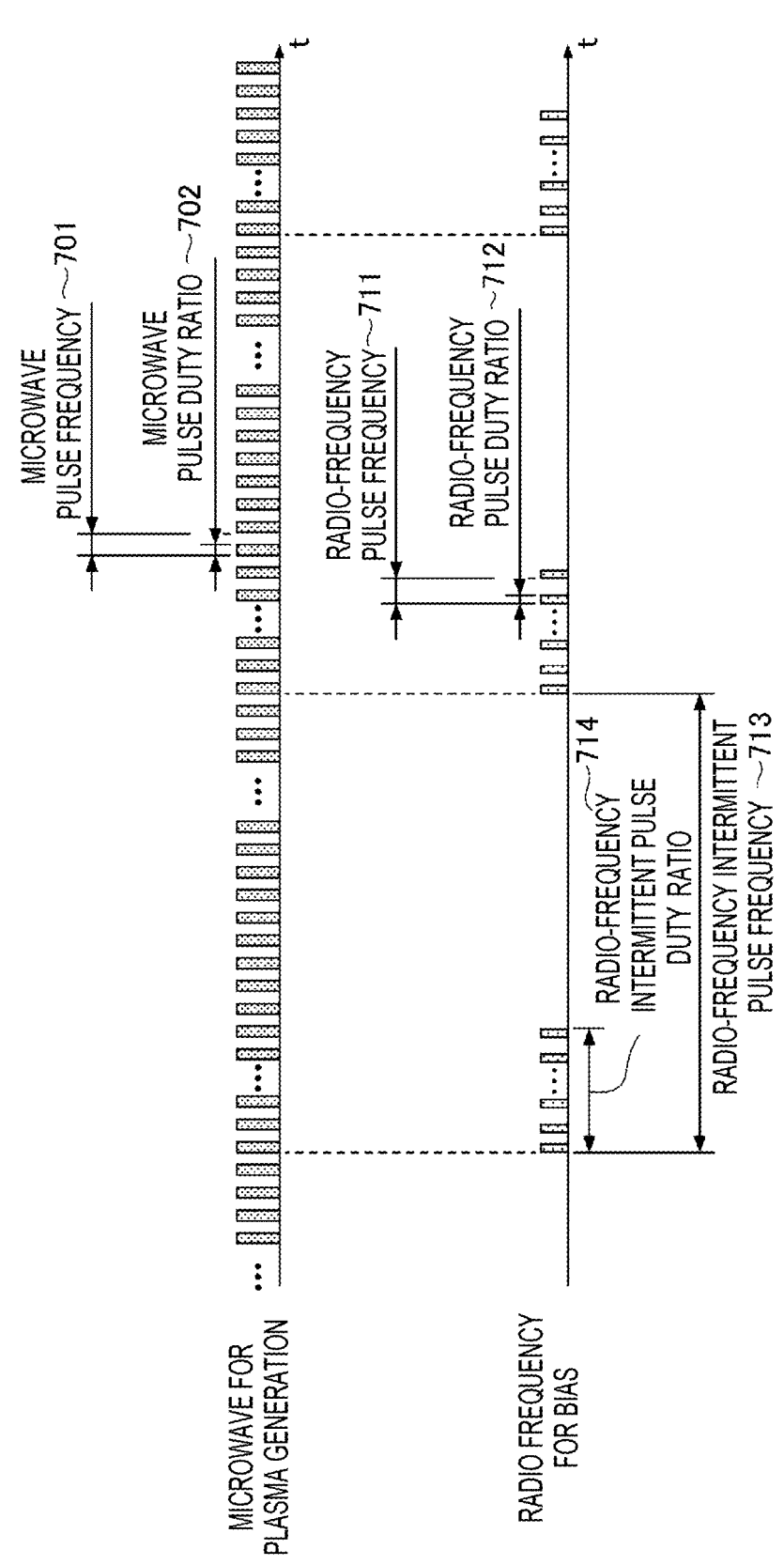
FIG. 7 is a first view illustrating an example of set parameters of the microwave pulse for plasma generation and the radio-frequency pulse for bias.
Figure 8:
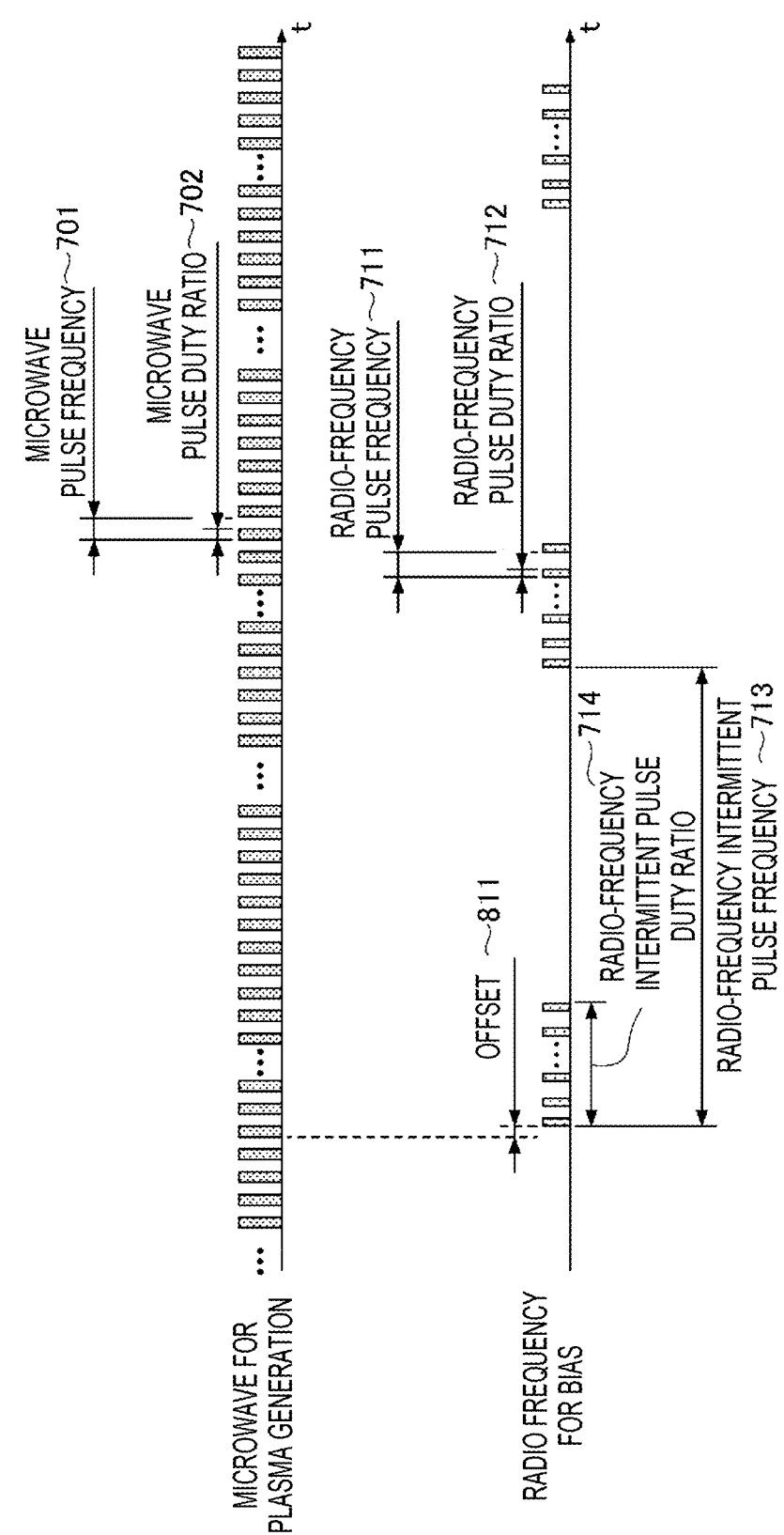
FIG. 8 is a second view illustrating an example of set parameters of the microwave pulse for plasma generation and the radio-frequency pulse for bias.

Next, descriptions are made on the set parameters (set parameters of the microwave pulse for plasma generation and the radio-frequency pulse for bias), which are searched to stabilize the reflection convergence time, and thus, avoid the occurrence of fluctuation or binarization, with reference to FIGS. 7 and 8. FIG. 7 is a first view illustrating an example of the set parameters of the microwave pulse for plasma generation and the radio-frequency pulse for bias.

As illustrated in the upper part of FIG. 7, the set parameters of the microwave pulse for plasma generation include microwave pulse frequency (reference numeral 701), and microwave pulse duty ratio (reference numeral 702).

As illustrated in the lower part of FIG. 7, the set parameters of the radio-frequency pulse for bias include radio-frequency pulse frequency (reference numeral 711), radio-frequency pulse duty ratio (reference numeral 712), radio-frequency intermittent pulse frequency (reference numeral 713), and radio-frequency intermittent pulse duty ratio (reference numeral 714).

FIG. 8 is a second view illustrating an example of the set parameters of the microwave pulse for plasma generation and the radio-frequency pulse for bias. The set parameters of the microwave pulse for plasma generation illustrated in the upper part of FIG. 8 are the same as the set parameters of the microwave pulse for plasma generation illustrated in the upper part of FIG. 7. Meanwhile, the set parameters of the radio-frequency pulse for bias illustrated in the lower part of FIG. 8 include radio-frequency pulse frequency (reference numeral 711), radio-frequency pulse duty ratio (reference numeral 712), radio-frequency intermittent pulse frequency (reference numeral 713), and radio-frequency intermittent pulse duty ratio (reference numeral 714), and further include offset (reference numeral 811).

(Relationship Between Each Set Parameter and Reflection Convergence Time)

Figure 10:
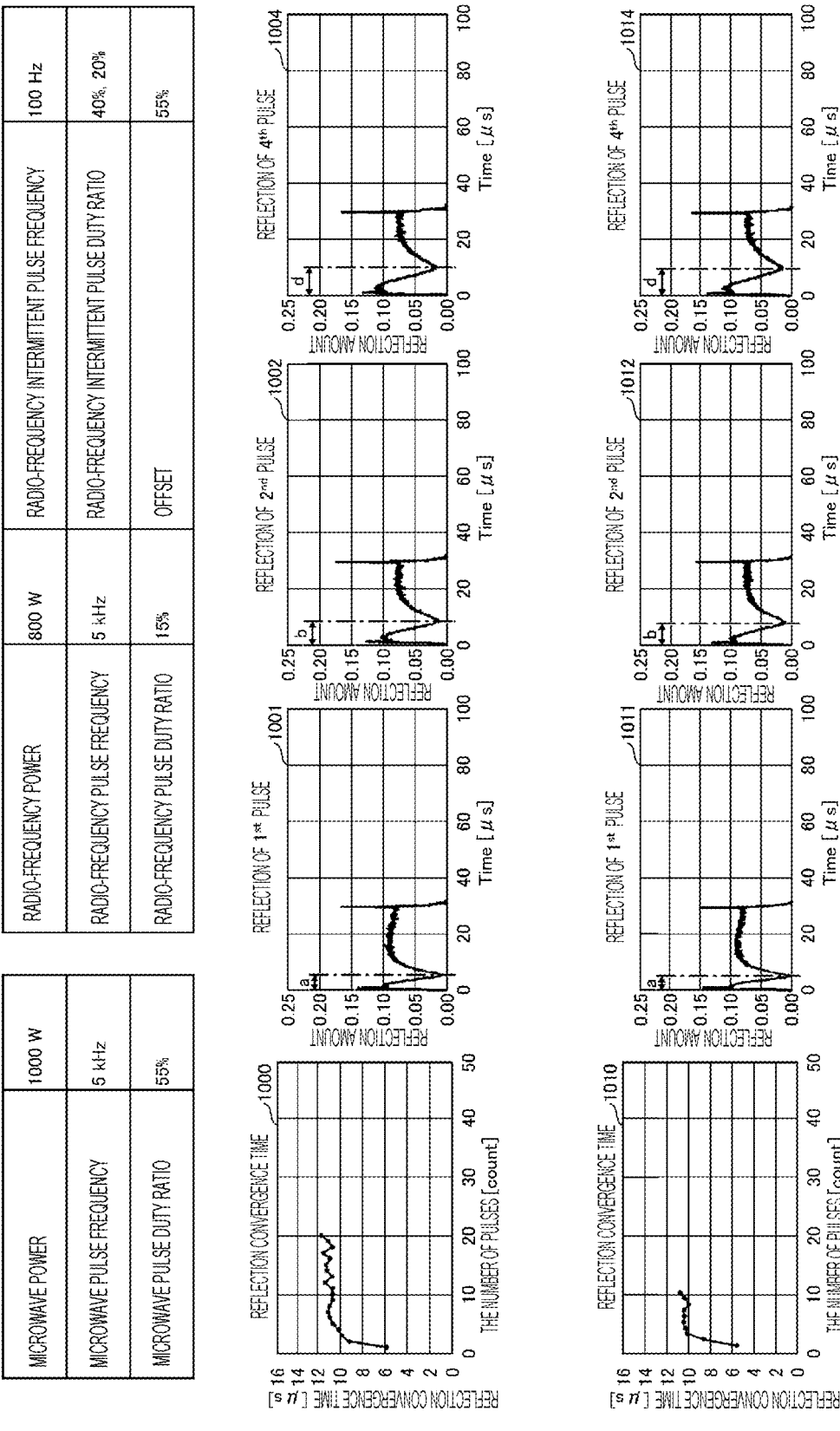
FIG. 10 is a second view illustrating an example of a reflection convergence time when the radio-frequency pulse for bias is driven intermittently.

Next, descriptions are made on the relationship between the set parameters of the microwave pulse for plasma generation and the radio-frequency pulse for bias, and the reflection convergence time, using FIGS. 9 and 10. FIGS. 9 and 10 are first and second views illustrating an example of the reflection convergence time when the radio-frequency pulse for bias is driven intermittently.

Specifically, FIGS. 9 and 10 illustrate the measurement of the reflection convergence time for each radio-frequency pulse when the radio-frequency pulse for bias is driven intermittently, in the state where predetermined set parameters are set as the set parameters of the microwave pulse for plasma generation predetermined set parameters are set for set parameters, excluding the radio-frequency intermittent pulse duty ratio (reference numeral 714), among the set parameters of the radio-frequency pulse for bias, and

various set parameters are set for the radio-frequency intermittent pulse duty ratio (reference numeral 714) among the set parameters of the radio-frequency pulse for bias.

In the examples of FIGS. 9 and 10, microwave power: 1,000 W, microwave pulse frequency: 5 kHz, microwave pulse duty ratio: 55%, radio-frequency power: 800 W, radio-frequency pulse frequency: 5 kHz radio-frequency pulse duty ratio: 15%, radio-frequency intermittent pulse frequency: 100 Hz, and offset: 55%, and the radio-frequency intermittent pulse duty ratio is changed in the range of 80% to 20%.

The graph 901 of FIG. 9 represents the time variation of the reflected wave for the radio-frequency pulse of a first pulse immediately after the transition from the intermittent OFF to the intermittent ON of the radio-frequency pulse for bias, in the state where 80% is specified as the radio-frequency intermittent pulse duty ratio. According to the graph 901 of FIG. 9, the reflection convergence time until the reflected wave for the radio-frequency pulse of the first pulse is stabilized is "a."

Similarly, the graph 902 of FIG. 9 represents the time variation of the reflected wave corresponding to the radio-frequency pulse of a second pulse immediately after the transition from the intermittent OFF to the intermittent ON of the radio frequency for bias, in the state where 80% is specified as the radio-frequency intermittent pulse duty ratio. According to the graph 902 of FIG. 9, the reflection convergence time until the reflected wave for the radio-frequency pulse of the second pulse is stabilized is "b."

Similarly, the graph 904 of FIG. 9 represents the time variation of the reflected wave for the radio-frequency pulse of a fourth pulse immediately after the transition from the intermittent OFF to the intermittent ON of the radio frequency for bias, in the state where 80% is specified as the radio-frequency intermittent pulse duty ratio. According to the graph 904 of FIG. 9, the reflection convergence time until the reflected wave for the radio-frequency pulse of the fourth pulse is stabilized is "d."

In FIG. 9, the graph 900 is a broken-line graph generated by sequentially plotting the reflection convergence time of each radio-frequency pulse measured based on the graphs 901, 902, . . . , and so on, according to the number of pulses.

Further, the graph 911 of FIG. 9 represents the time variation of the reflected wave corresponding to the radio-frequency pulse of a first pulse immediately after the transition from the intermittent OFF to the intermittent ON of the radio-frequency pulse for bias, in the state where 60% is specified as the radio-frequency intermittent pulse duty ratio. According to the graph 911 of FIG. 9, the reflection convergence time until the reflected wave for the radio-frequency pulse of the first pulse is stabilized is "a."

Similarly, the graph 912 of FIG. 9 represents the time variation of the reflected wave corresponding to the radio-frequency pulse of a second pulse immediately after the transition from the intermittent OFF to the intermittent ON of the radio-frequency pulse for bias, in the state where 60% is specified as the radio-frequency intermittent pulse duty ratio. According to the graph 912 of FIG. 9, the reflection convergence time until the reflected wave for the radio-frequency pulse of the second pulse is stabilized is "b."

Similarly, the graph 914 of FIG. 9 represents the time variation of the reflected wave corresponding to the radio-frequency pulse of a fourth pulse immediately after the transition from the intermittent OFF to the intermittent ON of the radio-frequency pulse for bias, in the state where 60% is specified as the radio-frequency intermittent pulse duty ratio. According to the graph 914 of FIG. 9, the reflection convergence time until the reflected wave for the radio-frequency pulse of the fourth pulse is stabilized is "d."

In FIG. 9, the graph 910 is a broken-line graph generated by sequentially plotting the reflection convergence time of each radio-frequency pulse measured based on the graphs 911, 912, . . . , and so on, according to the number of pulses.

The graph 1001 of FIG. 10 represents the time variation of the reflected wave corresponding to the radio-frequency pulse of a first pulse immediately after the transition from the intermittent OFF to the intermittent ON of the radio-frequency pulse for bias, in the state where 40% is specified as the radio-frequency intermittent pulse duty ratio. According to the graph 1001 of FIG. 10, the reflection convergence time until the reflected wave for the radio-frequency pulse of the first pulse is stabilized is "a."

Similarly, the graph 1002 of FIG. 10 represents the time variation of the reflected wave corresponding to the radio-frequency pulse of a second pulse immediately after the transition from the intermittent OFF to the intermittent ON of the radio-frequency pulse for bias, in the state where 40% is specified as the radio-frequency intermittent pulse duty ratio. According to the graph 1002 of FIG. 10, the reflection convergence time until the reflected wave for the radio-frequency pulse of the second pulse is stabilized is "b."

Similarly, the graph 1004 of FIG. 10 represents the time variation of the reflected wave corresponding to the radio-frequency pulse of a fourth pulse immediately after the transition from the intermittent OFF to the intermittent ON of the radio-frequency pulse for bias, in the state where 40% is specified as the radio-frequency intermittent pulse duty ratio. According to the graph 1004 of FIG. 10, the reflection convergence time until the reflected wave for the radio-frequency pulse of the fourth pulse is stabilized is "d."

In FIG. 10, the graph 1000 is a broken-line graph generated by sequentially plotting the reflection convergence time of each radio-frequency pulse measured based on the graphs 1001, 1002, . . . , and so on, according to the number of pulses.

The graph 1011 of FIG. 10 represents the time variation of the reflected wave corresponding to the radio-frequency pulse of a first pulse immediately after the transition from the intermittent OFF to the intermittent ON of the radio-frequency pulse for bias, in the state where 20% is specified as the radio-frequency intermittent pulse duty ratio. According to the graph 1011 of FIG. 10, the reflection convergence time until the reflected wave for the radio-frequency pulse of the first pulse is stabilized is "a."

Similarly, the graph 1012 of FIG. 10 represents the time variation of the reflected wave corresponding to the radio-frequency pulse of a second pulse immediately after the transition from the intermittent OFF to the intermittent ON of the radio-frequency pulse for bias, in the state where 20% is specified as the radio-frequency intermittent pulse duty ratio. According to the graph 1012 of FIG. 10, the reflection convergence time until the reflected wave for the radio-frequency pulse of the second pulse is stabilized is "b."

Similarly, the graph 1014 of FIG. 10 represents the time variation of the reflected wave corresponding to the radio-frequency pulse of a fourth pulse immediately after the transition from the intermittent OFF to the intermittent ON of the radio-frequency pulse for bias, in the state where 20% is specified as the radio-frequency intermittent pulse duty ratio. According to the graph 1014 of FIG. 10, the reflection convergence time until the reflected wave for the radio-frequency pulse of the fourth pulse is stabilized is "d."

In FIG. 10, the graph 1010 is a broken-line graph generated by sequentially plotting the reflection convergence time of each radio-frequency pulse measured based on the graphs 1011, 1012, . . . , and so on, according to the number of pulses.

(Analysis of Variation of Reflection Convergence Time)

Figure 11A:
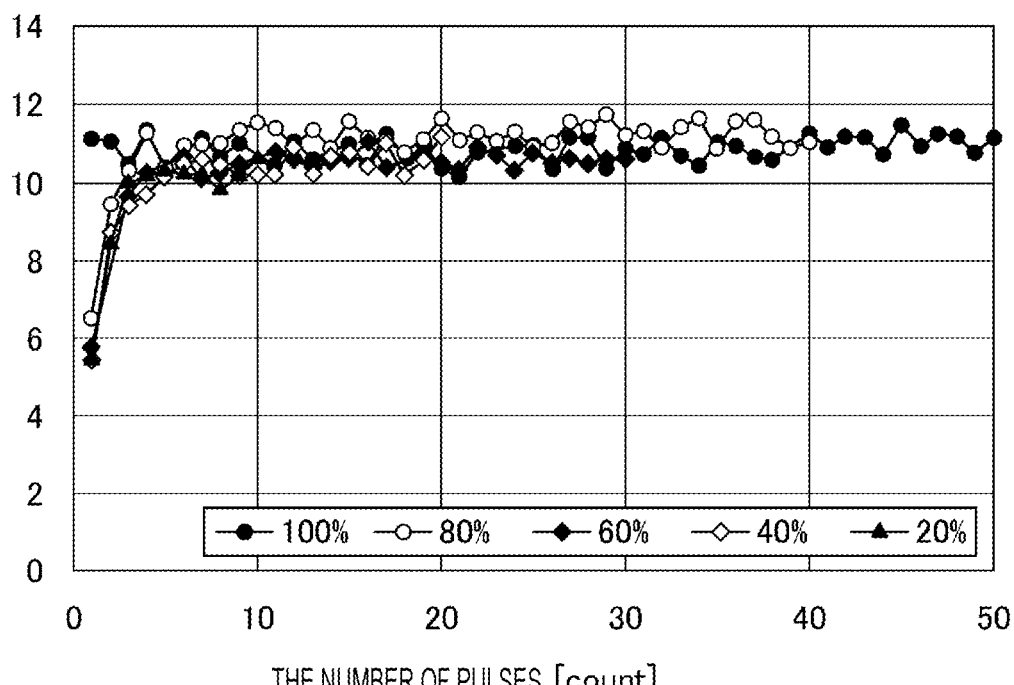
FIGS. 11A and 11B are views illustrating examples of analysis results obtained by analyzing the variation of the reflection convergence time.
Figure 11B:
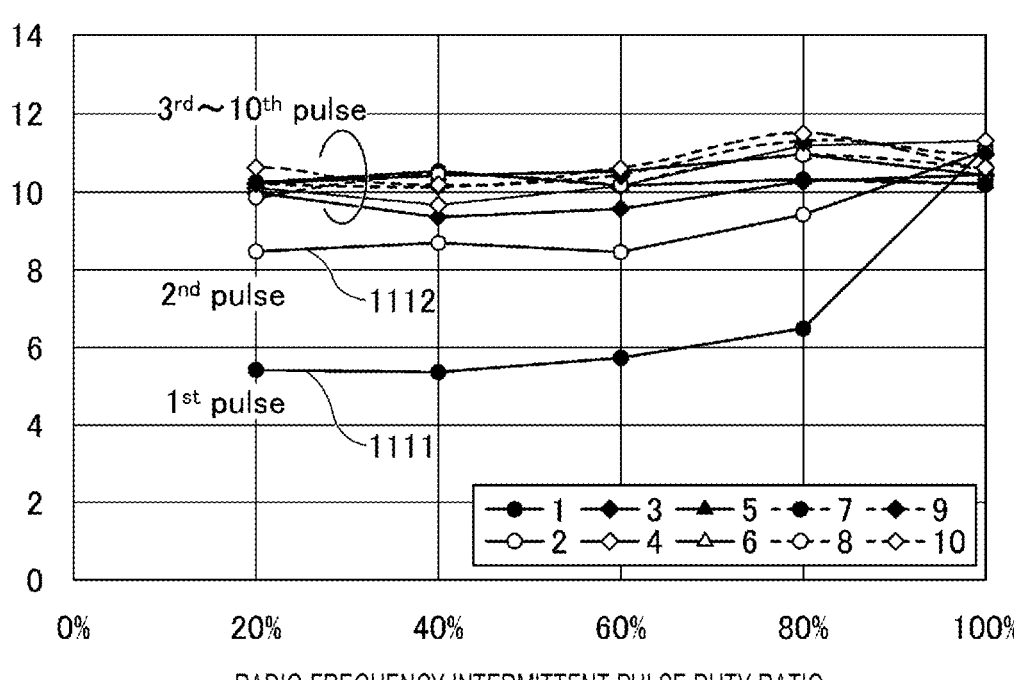

Next, an analysis is conducted on the variation of the reflection convergence time when the radio-frequency pulse for bias is driven intermittently (FIGS. 9 and 10). FIGS. 11A and 11B are views illustrating an example of analysis results obtained from analyzing the variation of the reflection convergence time.

FIG. 11A is obtained by combining the graphs 900 and 910 of FIG. 9 and the graphs 1000 and 1010 of FIG. 10 (which have different radio-frequency intermittent pulse duty ratios) into a single graph.

As illustrated in FIG. 11A, the reflection convergence time varies and is unstable in the several pulses immediately after the transition from the intermittent OFF time to the intermittent ON time, in any of the radio-frequency intermittent pulse duty ratios of 20% to 80%. Meanwhile, the variation of the reflection convergence time subsides and becomes stable.

FIG. 11B is a graph with the radio-frequency intermittent pulse duty ratio on the horizontal axis and the reflection convergence time on the vertical axis. For example, the broken-line graph 1111 is generated by plotting the respective reflection convergence times of the graphs 901 and 911 of FIG. 9 and the graphs 1001 and 1011 of FIG. 10 and connecting the graphs with broken lines. The broken-line graph 1112 is generated by plotting the respective reflection convergence times of the graphs 902 and 912 of FIG. 9 and the graphs 1002 and 1012 of FIG. 10 and connecting the graphs with broken lines.

As illustrated in FIG. 11B, the reflection convergence times of the first and second pulses immediately after the transition from the intermittent OFF time to the intermittent ON time deviate significantly from the reflection convergence times of the third and subsequent pulses, in any of the radio-frequency intermittent pulse duty ratios of 20% to 80%.

With the analysis results above, the following processes are performed based on each process condition:

performing a plasma processing with various combinations of the microwave power, the microwave pulse frequency, and the microwave pulse duty ratio as the set parameters of the microwave for plasma generation, determining a combination in which the standard deviation (variation) of the reflection convergence time becomes equal to or less than a threshold value, based on the determined combination, performing a plasma processing with various combinations of the radio-frequency power, the radio-frequency pulse frequency, the radio-frequency pulse duty ratio, and the offset as the set parameters of the radio-frequency pulse for bias, determining a combination in which the standard deviation of the reflection convergence time becomes equal to or less than a threshold value, based on the determined combination, performing a plasma processing with various combinations of the radio-frequency intermittent pulse frequency and the radio-frequency intermittent pulse duty ratio as other set parameters of the radio-frequency pulse for bias (set parameters other than the set parameters of the determined combination), and performing a "determination process" to determine a combination of other set parameters in which the standard deviation of the reflection convergence time calculated based on various numbers of masks becomes equal to or less than a threshold value and the number of masks is minimum, and further, derive the minimum number of masks.

Hereinafter, the functional configuration of the analysis apparatus 100 for implementing the determination process above is described, and then, the determination process is described in detail.

(Functional Configuration of Analysis Apparatus)

Figure 12:
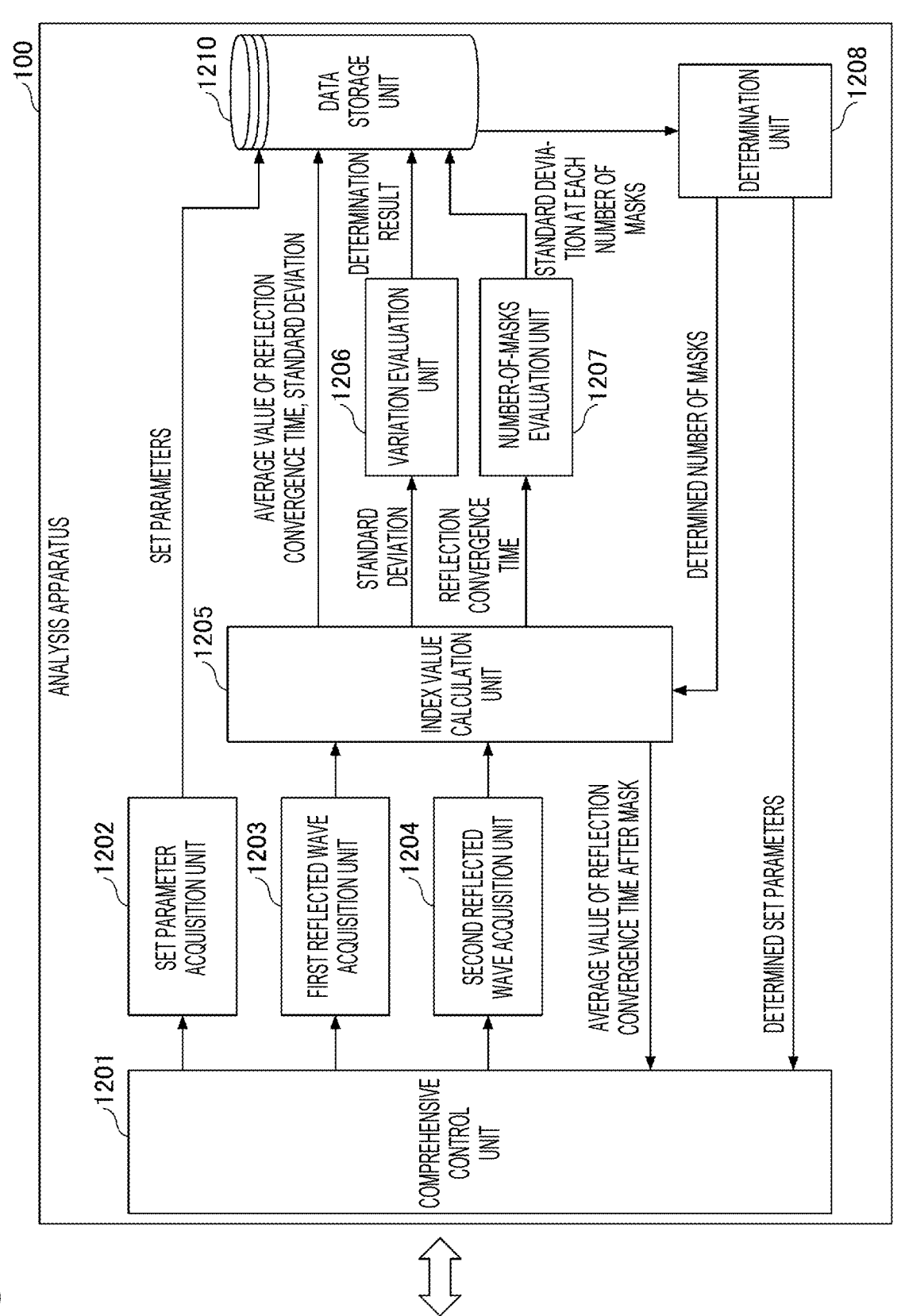
FIG. 12 is a view illustrating an example of a functional configuration of the analysis apparatus.

First, the functional configuration of the analysis apparatus 100 that performs the determination process above is described using FIG. 12. As described above, the comprehensive control program and the analysis program are installed in the analysis apparatus 100, and when the comprehensive control program is executed, the analysis apparatus 100 functions as a comprehensive control unit 1201. Further, when the analysis program is executed, the analysis apparatus 100 functions as a set parameter acquisition unit 1202, a first reflected wave acquisition unit 1203, a second reflected wave acquisition unit 1204, an index value calculation unit 1205, a variation evaluation unit 1206, a number-of-masks evaluation unit 1207, and a determination unit 1208.

The comprehensive control unit 1201 comprehensively controls each unit of the plasma processing apparatus 1, when the plasma processing apparatus 1 performs the plasma processing. Further, the comprehensive control performed by the comprehensive control unit 1201 when the determination process is performed includes, for example, specifying process conditions specifying set parameters in the microwave output device 16, specifying set parameters in the radio-frequency power supply 58 for bias, controlling the matcher accommodated in the matching unit 60 based on the reflection convergence time, receiving a signal of a reflected wave power corresponding to the microwave pulse for plasma generation, and receiving a signal of a reflected wave power corresponding to the radio-frequency pulse for bias.

The set parameter acquisition unit 1202 acquires the set parameters specified by the comprehensive control unit 1201 when the plasma processing apparatus 1 performs the plasma processing, and stores the acquired set parameters in the data storage unit 1210.

The first reflected wave acquisition unit 1203 acquires the signal of the reflected wave power corresponding to the microwave pulse for plasma generation, which is received by the comprehensive control unit 1201, and notifies the acquired signal to the index value calculation unit 1205.

The second reflected wave acquisition unit 1204 acquires the signal of the reflected wave power corresponding to the radio-frequency pulse for bias, which is received by the comprehensive control unit 1201, and notifies the acquired signal to the index value calculation unit 1205.

The index value calculation unit 1205 calculates the reflection convergence time (example of an index value), based on the signal of the reflected wave power corresponding to the microwave pulse for plasma generation. Further, the index value calculation unit 1205 calculates the reflection convergence time for the reflected wave corresponding to each of the plurality of microwave pulses included in the continuous pulse. Further, the index value calculation unit 1205 calculates an average value and a standard deviation based on each calculated reflection convergence time, and stores the calculated average value and standard deviation in the data storage unit 1210. Further, the index value calculation unit 1205 notifies the calculated standard deviation to the variation evaluation unit 1206.

Further, the index value calculation unit 1205 calculates the reflection convergence time (example of an index value) based on the signal of the reflected wave power corresponding to the radio-frequency pulse for bias. Further, the index value calculation unit 1205 calculates the reflection convergence time for the reflected wave corresponding to each of the plurality of radio-frequency pulses included in the intermittent pulse. Further, the index value calculation unit 1205 calculates an average value and a standard deviation based on each calculated reflection convergence time, and stores the calculated average value and standard deviation in the data storage unit 1210. Further, the index value calculation unit 1205 notifies each calculated reflection convergence time to the number-of-masks evaluation unit 1207. Further, the index value calculation unit 1205 calculates an average value of the reflection convergence times calculated for the reflection waves corresponding to the plurality of radio-frequency pulses, respectively, included in the intermittent pulse, while excluding the reflection convergence time corresponding to the number of masks notified from the determination unit 1208. Further, the index value calculation unit 1205 notifies the comprehensive control unit 1201 of the average value calculated while excluding the reflection convergence time corresponding to the notified number of masks (average value of reflection convergence times after mask). The reflection convergence time used to control the matcher accommodated in the matching unit 60 is the average value of the reflection convergence times after mask, which is notified by the index value calculation unit 1205.

The variation evaluation unit 1206 determines whether the standard deviation of the reflection convergence times notified by the index value calculation unit 1205 is equal to or less than a predetermined threshold value, and stores the determination result in the data storage unit 1210.

The number-of-masks evaluation unit 1207 calculates the standard deviation of the reflection convergence times notified by the index value calculation unit 1205 while changing the number of masks, and stores the standard deviation for each number of masks in the data storage unit 1210.

The determination unit 1208 acquires the standard deviation of the reflection convergence time when the microwave pulse for plasma generation is generated as a continuous pulse based on different set parameters. Then, based on the acquired standard deviation of the reflection convergence time, the determination unit 1208 determines the set parameters for the case where the microwave pulse for plasma generation is generated as a continuous pulse.

Further, the determination unit 1208 acquires the standard deviation of the reflection convergence time when the microwave pulse for plasma generation is generated as a continuous pulse based on the determined set parameters, and the radio-frequency pulse for bias is generated as an intermittent pulse based on different set parameters. Then, based on the acquired standard deviation of the reflection convergence time, the determination unit 1208 determines the set parameters and the number of masks for the case where the radio-frequency pulse for bias is generated as an intermittent pulse.

Further, the determination unit 1208 notifies the comprehensive control unit 1201 of the determined set parameters (the set parameters of the microwave pulse for plasma generation and the set parameters of the radio-frequency pulse for bias), and notifies the index value calculation unit 1205 of the determined number of masks.

(Flow of Determination Process Performed by Plasma Processing Apparatus)

Figure 13:
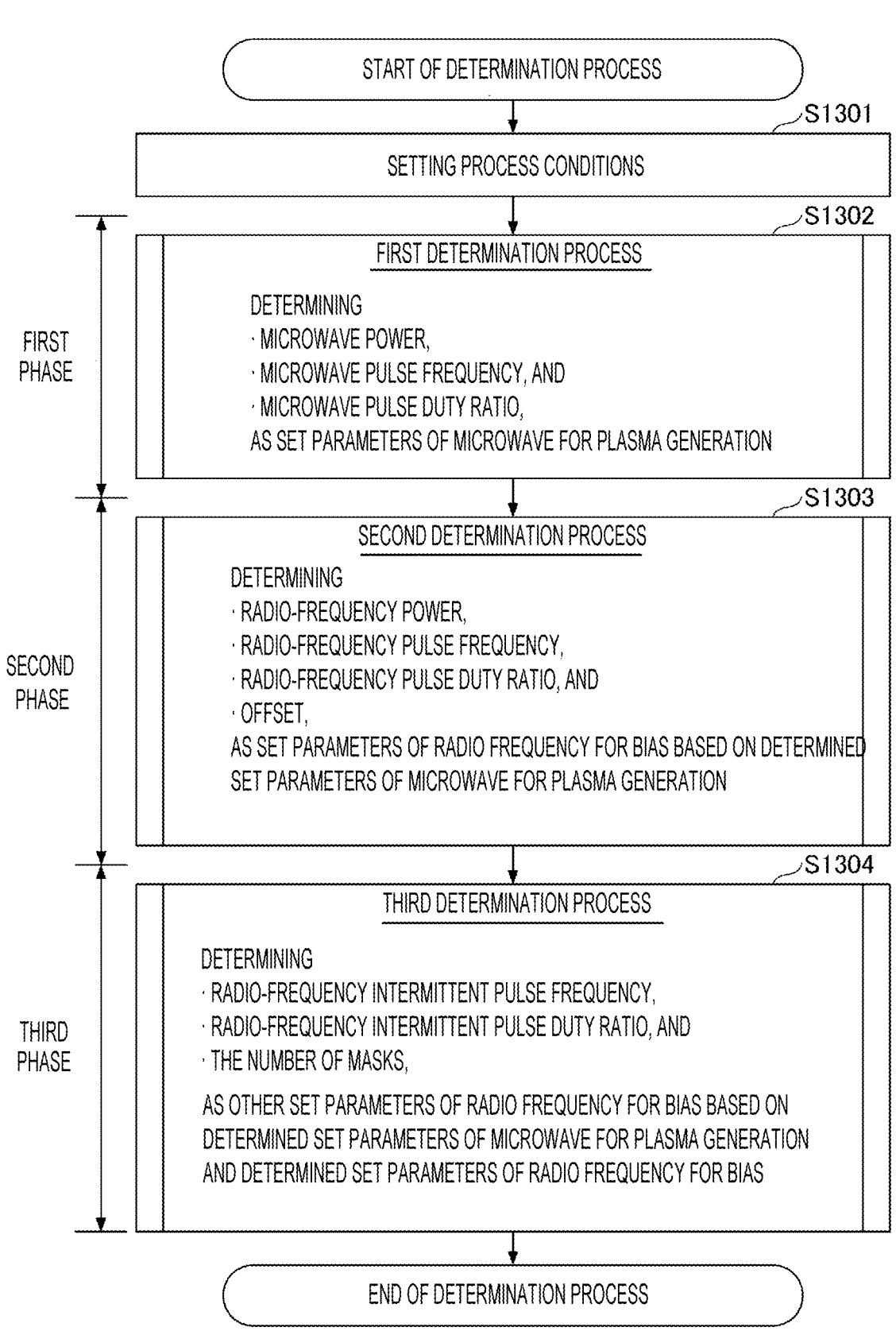
FIG. 13 is a flowchart illustrating the flow of a determination process by the plasma processing apparatus.

Next, the overall flow of the determination process performed by the plasma processing apparatus 1 is described. FIG. 13 is a flowchart illustrating the flow of the determination process performed by the plasma processing apparatus.

In step S1301, the comprehensive control unit 1201 specifies the pressure, the type of gas, and the flow rate of each gas as process conditions. The specified process conditions are stored in the data storage unit 1210.

In steps S1302 to S1304, a first determination process of a first phase, a second determination process of a second phase, and a third determination process of a third phase are performed, respectively.

In step S1302 of the first phase, the plasma processing apparatus 1 performs the first determination process. The first determination process includes performing a plasma processing based on the process conditions specified in step S1301, and determining the microwave power, the microwave pulse frequency, and the microwave pulse duty ratio as the set parameters of the microwave pulse for plasma generation.

The details of the first determination process are described herein below.

In step S1303 of the second phase, the plasma processing apparatus 1 performs the second determination process. The second determination process includes performing a plasma processing based on the set parameters of the microwave pulse for plasma generation, which are determined in step S1302, and determining the radio-frequency power, the radio-frequency pulse frequency, the radio-frequency pulse duty ratio, and the offset as the set parameters of the radio-frequency pulse for bias.

The details of the second determination process are described herein below.

In step S1304 of the third phase, the plasma processing apparatus 1 performs a third determination process. The third determination process includes performing a plasma processing based on the set parameters of the radio-frequency pulse for bias, which are determined in step S1303, and determining the radio-frequency intermittent pulse frequency, the radio-frequency intermittent pulse duty ratio, and the number of masks as other set parameters of the radio-frequency pulse for bias.

The details of the third determination process are described herein below.

(Details of First Determination Process)

Next, the first determination process (step S1302) are described in detail.

(1) Flow of First Determination Process

Figure 14:
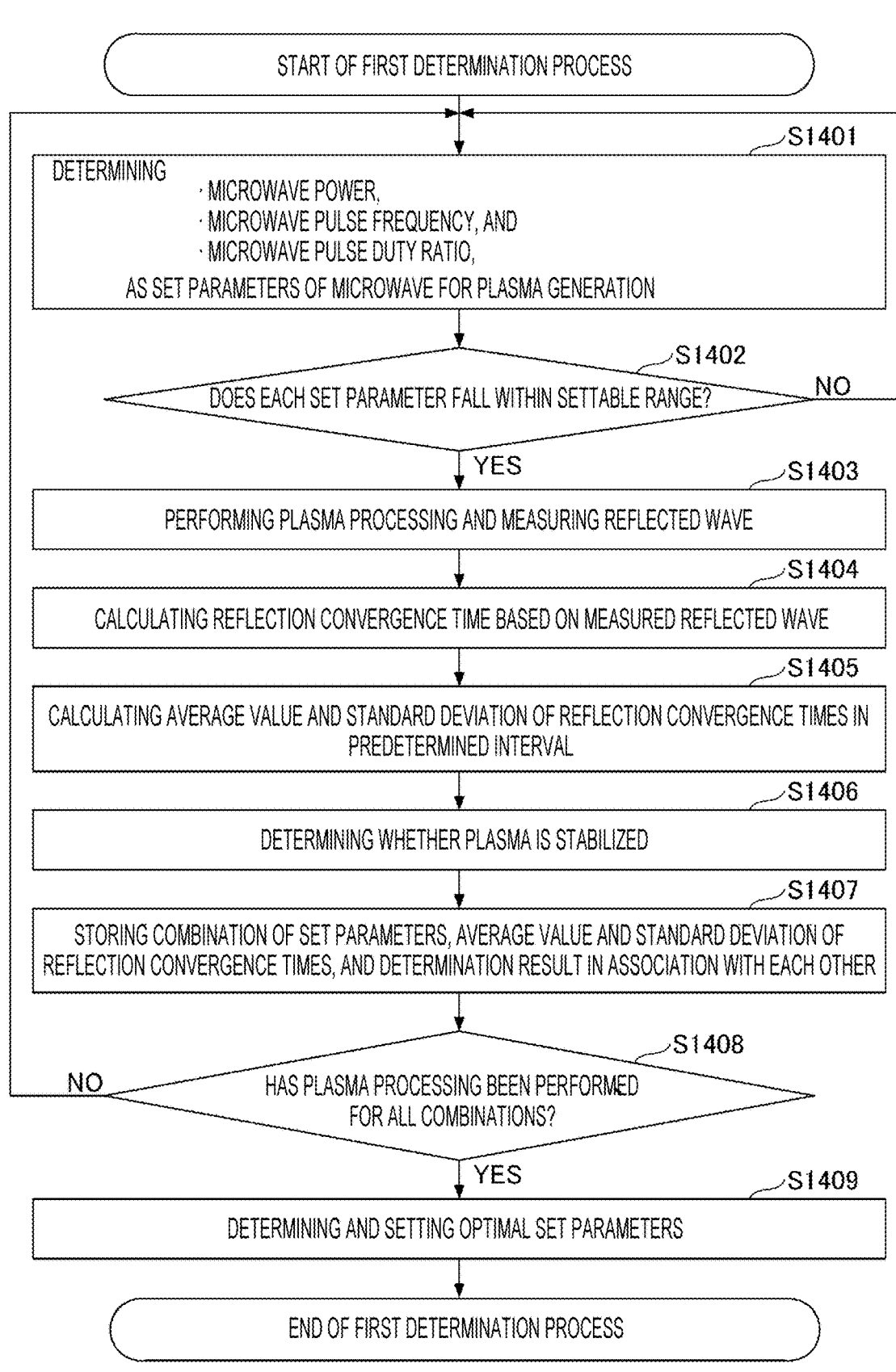
FIG. 14 is a flowchart illustrating the flow of a first determination process by the plasma processing apparatus.

First, the flow of the first determination process (step S1302) is described in detail. FIG. 14 is a flowchart illustrating the flow of the first determination process.

In step S1401, the comprehensive control unit 1201 receives settings for a predetermined combination of the microwave power, the microwave pulse frequency, and the microwave pulse duty ratio as the set parameters of the microwave pulse for plasma generation.

In step S1402, the comprehensive control unit 1201 determines whether each set parameter included in the combination of the received settings falls within the range settable in the plasma processing apparatus 1. When it is determined in step S1402 that each set parameter does not fall within the settable range (NO in step S1402), the process returns to step S1401 to receive settings for a combination that falls within the settable range.

Meanwhile, when it is determined in step S1402 that each set parameter falls within the settable range (YES in step S1402), the process proceeds to step S1403.

In step S1403, the plasma processing apparatus 1 performs a plasma processing, and measures the reflected wave power corresponding to each microwave pulse.

In step S1404, the first reflected wave acquisition unit 1203 acquires a signal of each reflected wave power measured by the plasma processing apparatus 1, and the index value calculation unit 1205 calculates each reflection convergence time.

In step S1405, the index value calculation unit 1205 calculates the average value and the standard deviation of the reflection convergence times in a predetermined interval.

In step S1406, the variation evaluation unit 1206 determines whether the calculated standard deviation of the reflection convergence times is equal to or less than a predetermined threshold value, to determine whether the plasma processing is stable.

In step S1407, the set parameter acquisition unit 1202 stores the combination of the set parameters specified in step S1401, in the data storage unit 1210. The index value calculation unit 1205 stores the average value and the standard deviation of the reflection convergence times calculated in step S1405, in the data storage unit 1210. The variation evaluation unit 1206 stores the determination result obtained in step S1406, in the data storage unit 1210.

The combination of the set parameters, the average value and the standard deviation of the reflection convergence times, and the determination result are all stored in the data storage unit 1210 in association with the process conditions specified in step S1301.

In step S1408, the comprehensive control unit 1201 determines whether the plasma processing has been performed for all of settable combinations. When it is determined in step S1408 that the plasma processing has not yet been performed for all of the settable combinations (NO in step S1408), the process returns to step S1401. Meanwhile, when it is determined in step S1408 that the plasma processing has been performed for all of the settable combinations (YES in step S1408), the process proceeds to step S1409.

In step S1409, the determination unit 1208 determines the optimal combination of set parameters as the set parameters of the microwave pulse for plasma generation, based on the determination result stored in the data storage unit 1210. After specifying the determined set parameters (the set parameters of the microwave pulse for plasma generation), the comprehensive control unit 1201 terminates the first determination process.

(2) Method of Calculating Reflection Convergence Time

Figure 15:
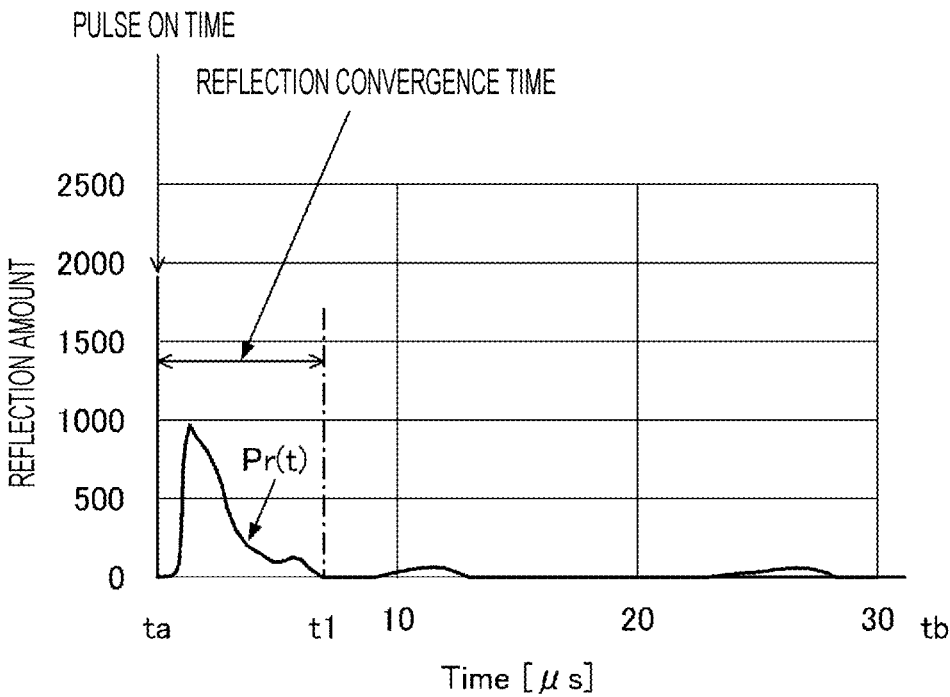
FIG. 15 is a view illustrating an example of a reflected wave power corresponding to the microwave pulse for plasma generation.

Next, descriptions are made on the method of calculating the reflection convergence time that is calculated by the index value calculation unit 1205 in step S1404 of the first determination process. FIG. 15 is a view illustrating an example of the reflected wave power corresponding to the microwave pulse for plasma generation. In FIG. 15, the horizontal axis represents the elapsed time after the microwave pulse for plasma generation is turned ON, and the vertical axis represents the reflected wave power Pr(t) at each elapsed time.

As illustrated in FIG. 15, the reflection convergence time is the time range from the time ta when the microwave pulse for plasma generation is turned ON, to the time t1 when the reflected wave power Pr(t) becomes equal to or less than a predetermined threshold value. That is, the reflection convergence time may be an example of an index value indicating the state of the reflected wave power corresponding to the microwave pulse for plasma generation.

(3) Data Stored in Data Storage Unit

Next, a specific example of the data stored in the data storage unit 1210 during the first determination process are described. FIG. 16 is a first view illustrating a specific example of the data stored in the data storage unit. As illustrated in FIG. 16, a table 1600 includes "Process Conditions," "Microwave for Plasma Generation," "Radio Frequency for Bias," and "Variation Evaluation," as information items.

The "Process Conditions" include the pressure, the type of gas, and the flow rate of each gas that are stored in step S1301.

In the "Microwave Power," the "Microwave Pulse Frequency," and the "Microwave Pulse Duty Ratio" of the "Microwave for Plasma Generation," the set parameters of the combination of set parameters stored in step S1407 are described, respectively.

In the "Average," the "Standard Deviation," and the "Determination Result" of the "Variation Evaluation," the average value and the standard deviation of the reflection convergence times and the determination result that are stored in step S1407 are described, respectively.

(Details of Second Determination Process)

Next, the second determination process (step S1303) are described in detail.

(1) Flow of Second Determination Process

Figure 17:
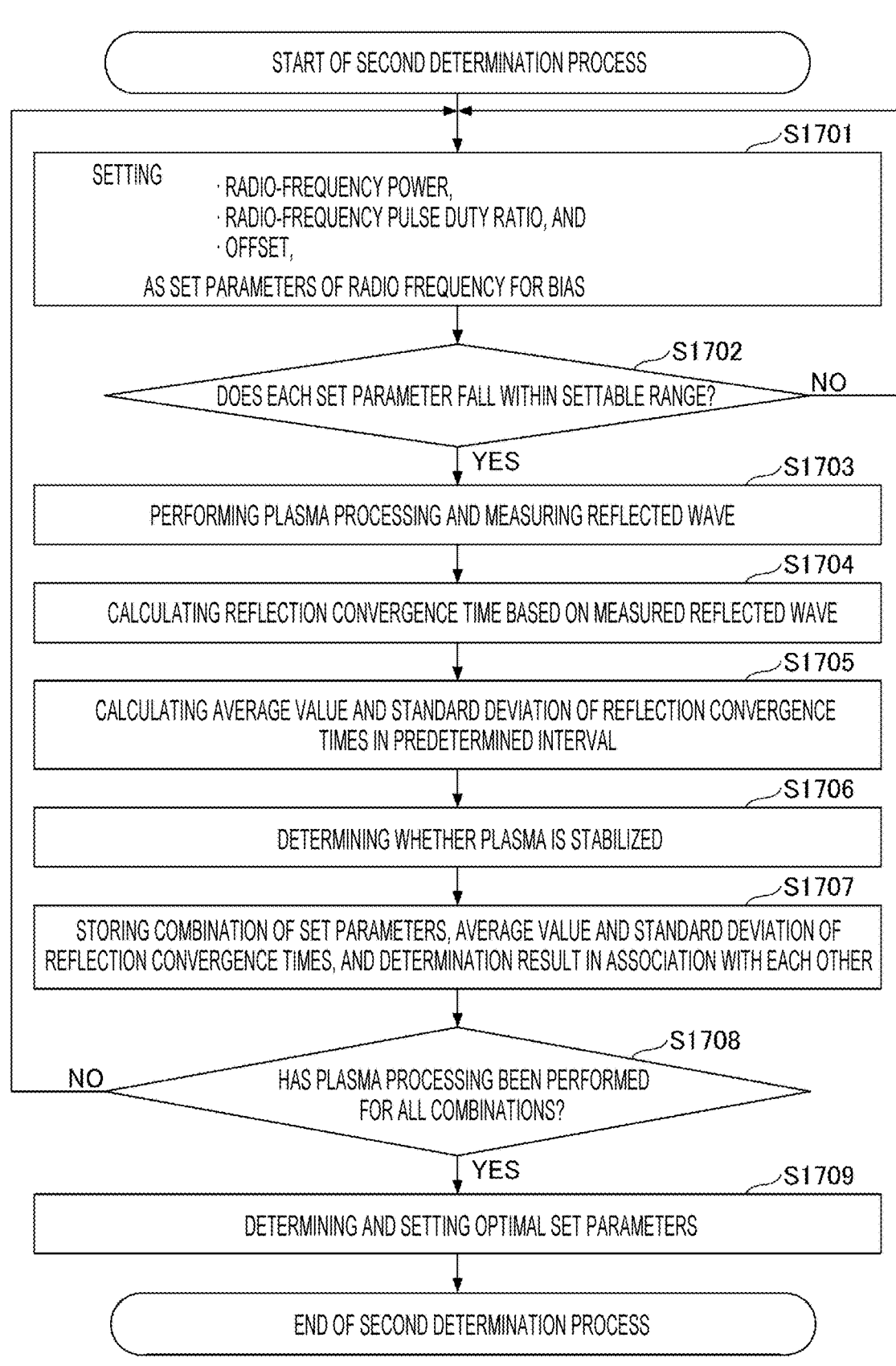
FIG. 17 is a flowchart illustrating the flow of a second determination process by the plasma processing apparatus.

First, the flow of the second determination process (step S1303) is described in detail. FIG. 17 is a flowchart illustrating the flow of the second determination process.

In step S1701, the comprehensive control unit 1201 receives settings for a predetermined combination of the radio-frequency power, the radio-frequency pulse duty ratio, and the offset as the set parameters of the radio-frequency pulse for bias.

In step S1702, the comprehensive control unit 1201 determines whether each set parameter included in the combination of the received setting falls within the range settable in the plasma processing apparatus 1. When it is determined in step S1702 that each set parameter does not fall within the settable range (NO in step S1702), the process returns to step S1701 to receive settings for a combination that falls within the settable range.

Meanwhile, when it is determined in step S1702 that each set parameter falls within the settable range (YES in step S1702), the process proceeds to step S1703.

In step S1703, the plasma processing apparatus 1 performs a plasma processing, and measures the reflected wave power corresponding to each radio-frequency pulse.

In step S1704, the second reflected wave acquisition unit 1204 acquires a signal of each reflected wave power measured by the plasma processing apparatus 1, and the index value calculation unit 1205 calculates each reflected convergence time.

In step S1705, the index value calculation unit 1205 calculates the average value and the standard deviation of the reflection convergence times in a predetermined interval.

In step S1706, the variation evaluation unit 1206 determines whether the calculated standard deviation of the reflection convergence times is equal to or less than a predetermined threshold value, to determine whether the plasma processing is stable.

In step S1707, the set parameter acquisition unit 1202 stores the combination of the set parameters specified in step S1701, in the data storage unit 1210. The index value calculation unit 1205 stores the average value and the standard deviation of the reflection convergence times calculated in step S1705, in the data storage unit 1210. The variation evaluation unit 1206 stores the determination result obtained in step S1706, in the data storage unit 1210.

The combination of the set parameters, the average value and the standard deviation of the reflection convergence times, and the determination result are all stored in the data storage unit 1210 in association with the combination of set parameters of the microwave pulse for plasma generation that is determined in step S1409.

In step S1708, the comprehensive control unit 1201 determines whether the plasma processing has been performed for all of settable combinations. When it is determined in step S1708 that the plasma processing has not yet been performed for all of the settable combinations (NO in step S1708), the process returns to step S1701. Meanwhile, when it is determined in step S1708 that the plasma processing has been performed for all of the settable combinations (YES in step S1708), the process proceeds to step S1709.

In step S1709, the determination unit 1208 determines the optimal combination of set parameters as the set parameters of the radio-frequency pulse for bias, based on the determination result stored in the data storage unit 1210. After specifying the determined set parameters (the set parameters of the radio frequency for bias), the comprehensive control unit 1201 terminates the second determination process.

(2) Method of Calculating Reflection Convergence Time

Figure 18:
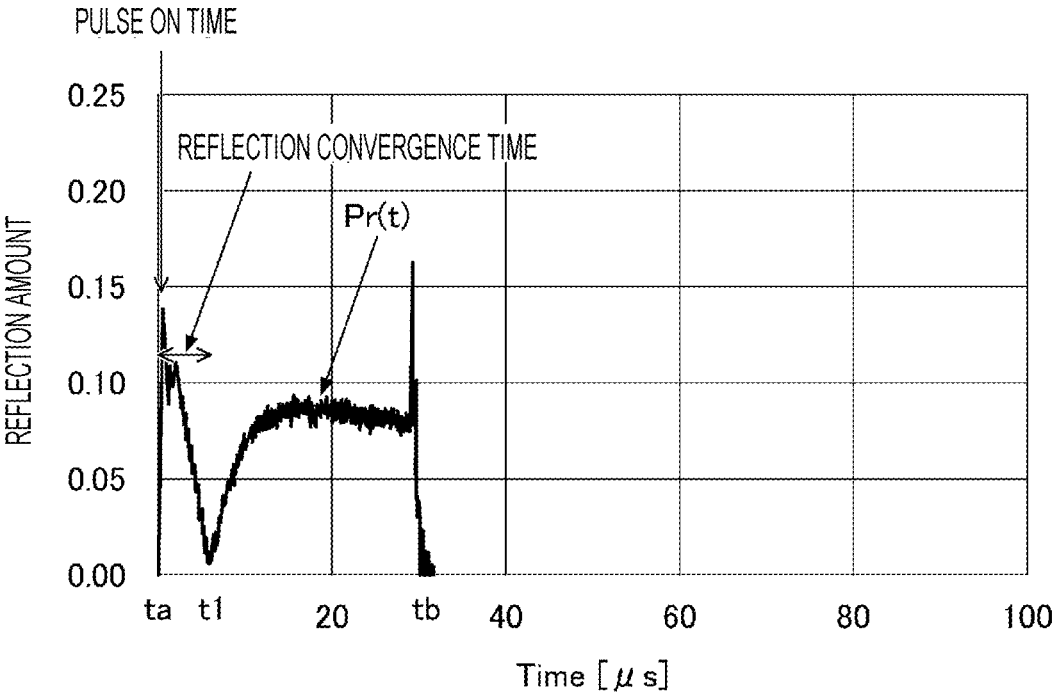
FIG. 18 is a first view illustrating an example of a reflected wave power corresponding to the radio-frequency pulse for bias.

Next, descriptions are made on the method of calculating the reflection convergence time that is calculated by the index value calculation unit 1205 in step S1704 of the second determination process. FIG. 18 is a first view illustrating an example of the reflected wave power corresponding to the radio-frequency pulse for bias. In FIG. 18, the horizontal axis represents the elapsed time after the radio-frequency pulse for bias is turned ON, and the vertical axis represents the reflected wave power Pr(t) at each elapsed time.

As illustrated in FIG. 18, the reflection convergence time is the time range from the time ta when the radio-frequency pulse for bias is turned ON, to the time t1 when the reflected wave power Pr(t) becomes minimum. That is, the reflection convergence time may be an example of an index value indicating the state of the reflected wave power corresponding to the radio-frequency pulse for bias.

Meanwhile, the index value calculation unit 1205 performs a moving average process for the reflected wave power Pr(t) over the time ta to the time tb, which is the time range of the pulse ON corresponding to one pulse. Then, in the index value calculation unit 1205, the time t1 when the reflected wave power Pr(t) becomes minimum after the moving average process is set as the time when the reflected wave power Pr(t) becomes minimum.

In the present embodiment, the average value of the reflection convergence times is calculated based on the reflection convergence time calculated for each of the "n" number of radio-frequency pulses included in the intermittent pulse. Similarly, the standard deviation of the reflection convergence times is calculated based on the reflection convergence time calculated for each of the "n" number of radio-frequency pulses included in the intermittent pulse.

(3) Data Stored in Data Storage Unit

Next, a specific example of the data stored in the data storage unit 1210 during the second determination process are described. FIG. 19 is a second view illustrating a specific example of the data stored in the data storage unit. As illustrated in FIG. 19, a table 1900 includes "Process Conditions," "Microwave for Plasma Generation," "Radio Frequency for Bias," and "Variation Evaluation," as information items.

In the "Process Conditions," the pressure, the type of gas, and the flow rate of each gas that are stored in step S1301 are described.

In the "Microwave Power," the "Microwave Pulse Frequency," and the "Microwave Pulse Duty Ratio" of the "Microwave for Plasma Generation," the set parameters of the combination of the set parameters determined in step S1409 are described, respectively.

Meanwhile, in the "Radio-Frequency Power," the "Radio-Frequency Pulse Duty Ratio," and the "Offset" of the "Radio Frequency for Bias," the set parameters of the combination of the set parameters stored in step S1707 is described, respectively.

In the "Average," the "Standard Deviation," and the "Determination Result" of the "Variation Evaluation," the average value and the standard deviation of the reflection convergence times and the determination result that are stored in step S1407 are described, respectively.

(Details of Third Determination Process)

Next, the third determination process (step S1304) are described in detail.

(1) Flow of Third Determination Process

First, the flow of the third determination process (step S1304) is described in detail. FIG. 20 is a flowchart illustrating the flow of the third determination process.

In step S2001, the comprehensive control unit 1201 receives settings for a predetermined combination of the "radio-frequency intermittent pulse frequency" and the "radio-frequency intermittent pulse duty ratio" as the set parameters for the radio-frequency pulse for bias.

In step S2002, the comprehensive control unit 1201 determines whether each set parameter included in the combination of the received settings falls within the range settable in the plasma processing apparatus 1. When it is determined in step S2002 that each set parameter does not fall within the settable range (NO in step S2002), the process returns to step S2001 to receive settings for a combination that falls within the settable range.

Meanwhile, when it is determined in step S2002 that each set parameter falls within the settable range (YES in step S2002), the process proceeds to step S2003.

In step S2003, the plasma processing apparatus 1 performs a plasma processing, and measures the reflected wave power corresponding to each radio-frequency pulse.

In step S2004, the second reflected wave acquisition unit 1204 acquires a signal of each reflected wave power measured by the plasma processing apparatus 1, and the index value calculation unit 1205 calculates each reflection convergence time.

In step S2005, the index value calculation unit 1205 calculates the standard deviation of the reflection convergence times in a predetermined interval.

In step S2006, the number-of-masks evaluation unit 1207 calculates the standard deviation of the reflection convergence times in a predetermined interval while excluding the reflection convergence time corresponding to a first pulse (the number of masks=1) among the radio-frequency pulses immediately after the transition from the intermittent OFF time to the intermittent ON time, calculates the standard deviation of the reflection convergence times in a predetermined interval while excluding the reflection convergence times corresponding to first and second pulses (the number of masks=2), respectively, among the same radio-frequency pulses, calculates the standard deviation of the reflection convergence times in a predetermined interval while excluding the reflection convergence times corresponding to first to third second pulses (the number of masks=3), respectively, among the same radio-frequency pulses, . . . , and calculates the standard deviation of the reflection convergence times in a predetermined interval while excluding the reflection convergence times corresponding to first to "m-th" pulses (the number of masks=m), respectively, among the same radio-frequency pulses.

In step S2007, the set parameter acquisition unit 1202 stores the combination of set parameters specified in step S2001, in the data storage unit 1210. The index value calculation unit 1205 stores the standard deviation of the reflection convergence times calculated in step S2006, in the data storage unit 1210. The number-of-masks evaluation unit 1207 stores the standard deviation of the reflection convergence times for each number of masks, which is calculated in step S2006, in the data storage unit 1210.

The combination of set parameters, the standard deviation of the reflection convergence times, and the standard deviation of reflection convergence times for each number of masks are all stored in association with the combination of set parameters of the microwave pulse for plasma generation that is determined in step S1709.

In step S2008, the comprehensive control unit 1201 determines whether the plasma processing has been performed for all of settable combinations. When it is determined in step S2008 that the plasma processing has not yet been performed for all of the settable combinations (NO in step S2008), the process returns to step S2001. Meanwhile, when it is determined in step S2008 that the plasma processing has been performed for all of the settable combinations (YES in step S2008), the process proceeds to step S2009.

In step S2009, the determination unit 1208 determines the optimal combination of set parameters as the set parameters of the radio-frequency pulse for bias, and furthermore, derives the optimal number of masks, based on the data stored in the data storage unit 1210. Specifically, the determination unit 1208 determines a combination of the radio-frequency intermittent pulse frequency and the radio-frequency intermittent pulse duty ratio, in which the standard deviation of the reflection convergence times calculated in step S2006 based on various numbers of masks is equal to or less than a threshold value, and the number of masks is minimum, and and derives the number of masks at this time (the minimum number of masks). Then, the determination unit 1208 terminates the determination process.

(3) Method of Calculating Reflection Convergence Time

Figure 21:
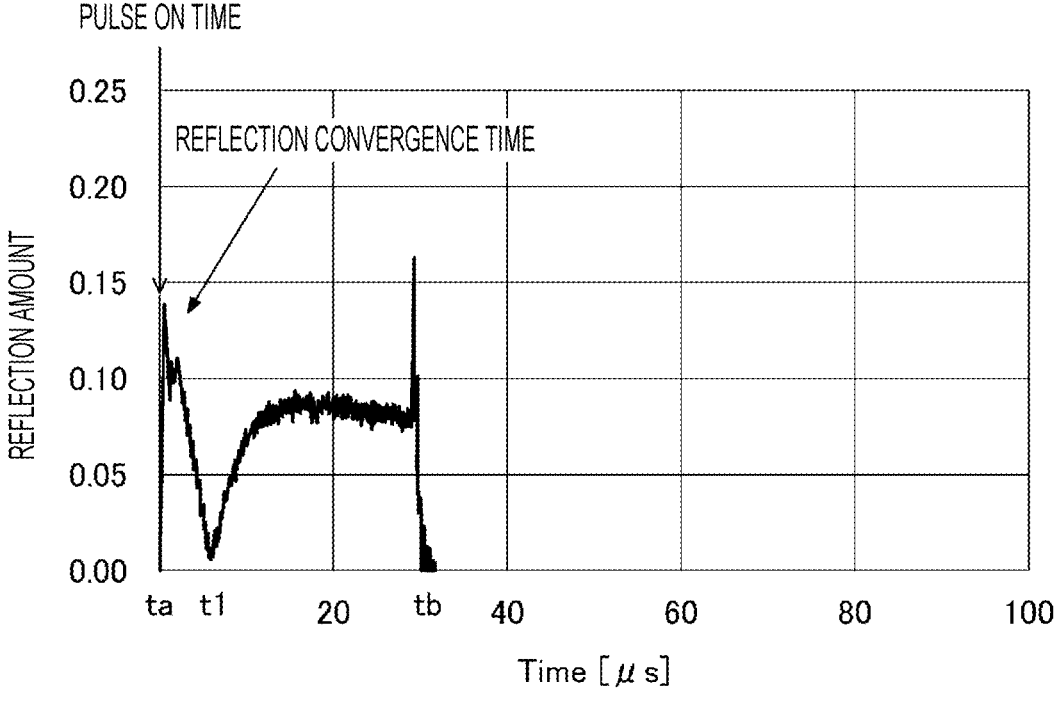
FIG. 21 is a second view illustrating an example of a reflected wave power corresponding to the radio-frequency pulse for bias.

Next, descriptions are made on the method of calculating the reflection convergence time that is calculated by the index value calculation unit 1205 in step S2004 of the third determination process. FIG. 21 is a second view illustrating an example of the reflected wave power corresponding to the radio-frequency pulse for bias. In FIG. 21, the horizontal axis represents the elapsed time after the radio-frequency pulse for bias is turned ON, and the vertical axis represents the reflected wave power Pr(t) at each elapsed time.

As illustrated in FIG. 21, the reflection convergence time is the time range from the time ta when the radio-frequency pulse for bias is turned ON, to the time t1 when the reflected wave power Pr(t) becomes minimum. That is, the reflection convergence time may be an example of an index value indicating the state of the reflected wave power corresponding to the radio-frequency pulse for bias.

Meanwhile, the index value calculation unit 1205 performs a moving average process for the reflected wave power Pr(t) over the time ta to the time tb, which is the time range of the pulse ON corresponding to one pulse. Then, in the index value calculation unit 1205, the time t1 when the reflected wave power Pr(t) becomes minimum after the moving average process is set as the time when the reflected wave power Pr(t) becomes minimum.

In the present embodiment, the average value of the reflection convergence times is calculated based on the reflection convergence time calculated for each of the "n" number of radio-frequency pulses included in the intermittent pulse. Similarly, the standard deviation of the reflection convergence times is calculated based on the reflection convergence time calculated for each of the "n" number of radio-frequency pulses included in the intermittent pulse.

(3) Data Stored in Data Storage Unit

Next, a specific example of the data stored in the data storage unit 1210 during the third determination process are described. FIG. 22 is a third view illustrating a specific example of the data stored in the data storage unit. As illustrated in FIG. 22, a table 2200 includes "Process Conditions," "Microwave for Plasma Generation," "Radio Frequency for Bias," and "Number-of-Masks Evaluation," as information items.

In the "Microwave Power," the "Microwave Pulse Frequency," and the "Microwave Pulse Duty Ratio" of the "Microwave for Plasma Generation," the set parameters of the combination of set parameters determined in step S1409 are described, respectively.

Meanwhile, in the "Radio-Frequency Intermittent Pulse Frequency" and the "Radio-Frequency Intermittent Pulse Duty Ratio" of the "Radio Frequency for Bias," the set parameters of the combination of set parameters stored in step S2007 are described, respectively.

In the "Number-of-Masks Evaluation,"

in the "Number of Masks 0," the standard deviation calculated in step S2005 and stored in step S2007 is described, and in the "Number of Masks 1," the "Number of Masks 2," . . . , each standard deviation calculated in step S2007 and stored in step S2007 is described.

(Relationship Between Number of Masks and Standard Deviation of Reflection Convergence Times)

Figure 23:
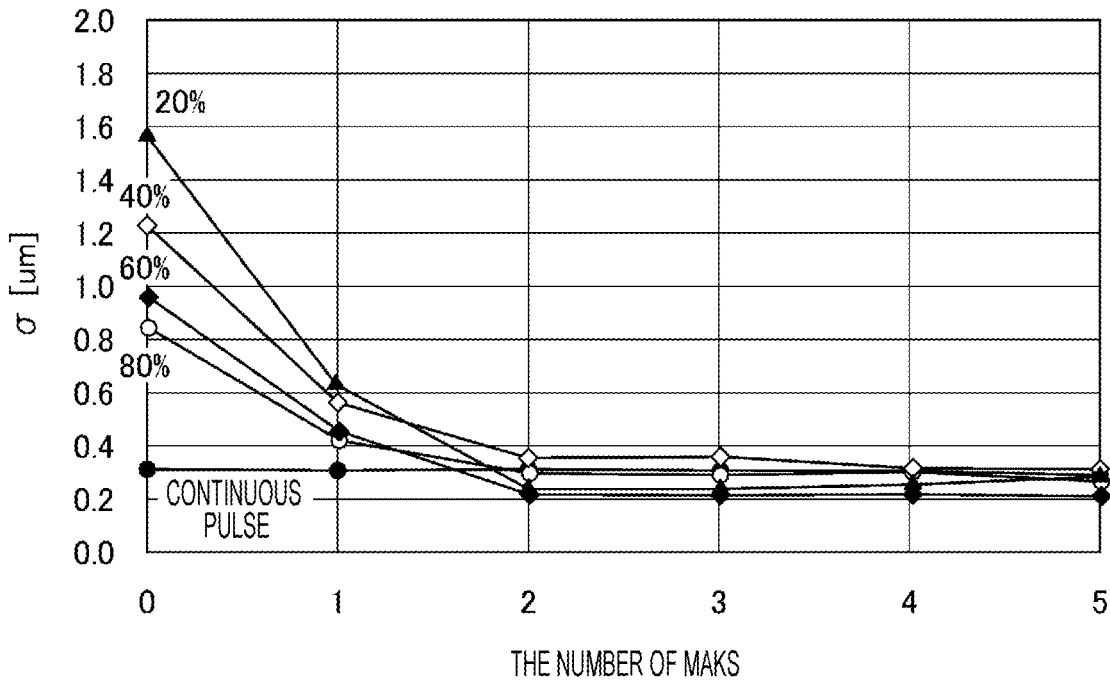
FIG. 23 is a view illustrating a relationship between the number of masks and the standard deviation of the reflection convergence time.

Next, descriptions are made on the relationship between the number of masks and the standard deviation of the reflection convergence times, which are described in the "Number-of-Masks Evaluation" of Table 2200. FIG. 23 is a view illustrating the relationship between the number of masks and the standard deviation of the reflection convergence times.

In FIG. 23, the horizontal axis represents the number of masks, and the vertical axis represents the standard deviation of the reflection convergence times. According to the example of FIG. 23, the standard deviation of the reflection convergence times becomes stable when the number of masks is 2 or higher, regardless of the radio-frequency intermittent pulse duty ratio.

(Summary)

As clear from the descriptions above, the plasma processing apparatus 1 according to the first embodiment performs a plasma processing in the manner that a radio-frequency power supply for plasma generation and a radio-frequency power supply for bias generate a microwave pulse and a radio-frequency pulse, respectively, and a matcher controls a load-side impedance of the radio-frequency power supply for bias, acquires a power of a corresponding reflected wave when the radio-frequency power supply for plasma generation generates a continuous pulse, and the radio-frequency power supply for bias generates an intermittent pulse, based on different set parameters, and calculates a reflection convergence time, and determines set parameters to be specified in the radio-frequency power supply for plasma generation and the radio-frequency power supply for bias, based on the standard deviation of the calculated reflection convergence time, and further, derives the number of masks indicating a pulse range to be excluded from a calculation target when the average value of the reflection convergence time to be used for controlling the matcher is calculated.

Thus, according to the plasma processing apparatus of the first embodiment, the microwave pulse for plasma generation may be driven continuously, and the radio-frequency pulse for bias may be driven intermittently, based on the set parameters in which the variation of the reflection convergence time is equal to or less than a threshold value, and the average value of the reflection convergence time may be calculated based on the number of masks derived to stabilize the average value of the reflection convergence time, so that the reflection convergence time used to control the matcher may be stabilized.

Therefore, according to the first embodiment, the binarization of the matching position or the occurrence of fluctuation may be avoided. As a result, according to the first embodiment, the plasma processing by the plasma processing apparatus 1 may be stabilized.

That is, according to the first embodiment, it is possible to provide a plasma processing apparatus, an analysis apparatus, and an analysis program, which stabilize a plasma processing.

Second Embodiment

In the first embodiment above, the index value indicating the state of the reflected wave power corresponding to the microwave pulse for plasma generation is the reflection convergence time, and is calculated by the calculation method illustrated in FIG. 15. However, the index value indicating the state of the reflected wave power corresponding to the microwave pulse for plasma generation is not limited to the reflection convergence time.

Similarly, in the first embodiment, the index value indicating the state of the reflected wave power corresponding to the radio-frequency pulse for bias is the reflection convergence time, and is calculated by the calculation method illustrated in FIGS. 18 and 21. However, the index value indicating the state of the reflected wave power corresponding to the radio-frequency pulse for bias is not limited to the reflection convergence time.

Figure 24A:
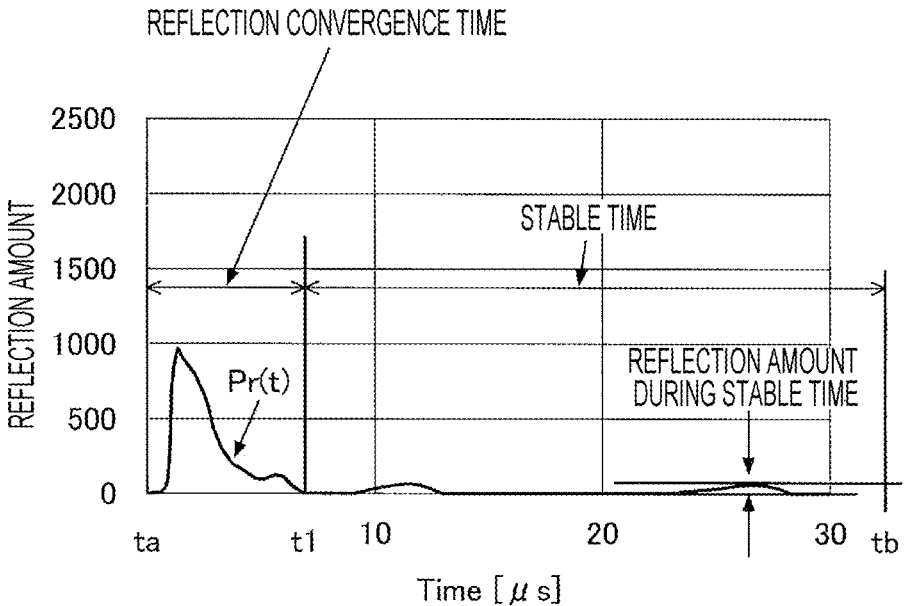
FIGS. 24A and 24B are views illustrating another example of index values.
Figure 24B:
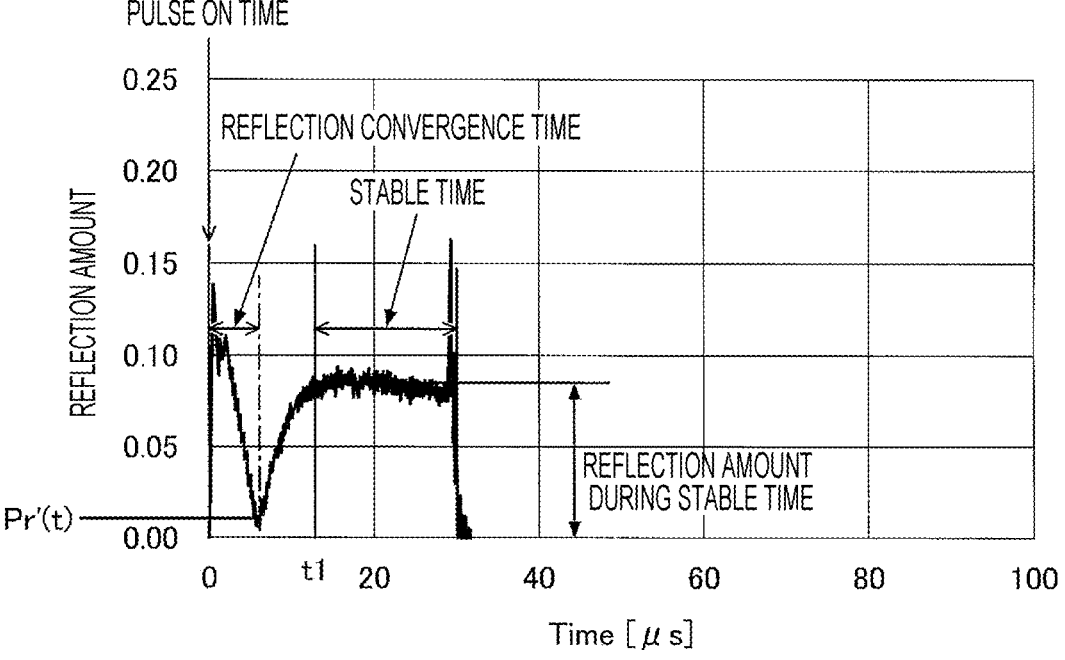

FIGS. 24A and 24B are views illustrating another example of the index value. FIG. 24A is another example of the index value indicating the state of the reflected wave power corresponding to the microwave pulse for plasma generation.

In FIG. 24A, the horizontal axis represents the elapsed time after the microwave pulse for plasma generation is turned ON, and the vertical axis represents the reflected wave power Pr(t) at each elapsed time.

As illustrated in FIG. 24A, in the second embodiment, the index value may be the stable time. Here, the stable time indicates the time range from the time t1 when the reflected wave power Pr(t) becomes equal to or less than a predetermined threshold value, to the time tb when the microwave pulse for plasma generation is turned OFF.

In the second embodiment, the index value may be a reflection amount during a stable time. Here, the reflection amount during the stable time indicates the average value of the reflected wave power Pr(t) in the time range from the time t1 when the reflected wave power Pr(t) becomes equal to or less than a predetermined threshold value, to the time tb when the microwave pulse for plasma generation is turned OFF.

Meanwhile, FIG. 24B is another example of the index value indicating the state of the reflected wave power corresponding to the radio-frequency pulse for bias.

In FIG. 24B, the horizontal axis represents the elapsed time after the microwave pulse for plasma generation is turned ON, and the vertical axis represents the reflected wave power Pr'(t) at each elapsed time.

As illustrated in FIG. 24B, in the second embodiment, the index value may be the stable time. Here, the stable time indicates the time range, in which the variation of a reflected wave power Pr'(t) becomes equal to or less than a predetermined threshold value after the time t1 when the reflected wave power Pr'(t) is minimum.

In the second embodiment, the index value may be the reflection amount during the stable time. Here, the reflection amount during the stable time indicates the average value of the reflected wave power Pr'(t) in the time range, in which the variation of the reflected wave power Pr'(t) becomes equal to or less than a predetermined threshold value after the time t1 when the reflected wave power Pr'(t) is minimum.

Third Embodiment

In each of the embodiments above, the specific examples of the microwave pulse for plasma generation and the radio-frequency pulse for bias are described referring to FIG. 5, in which the microwave pulse for plasma generation is output as a continuous pulse. However, the microwave pulse for plasma generation may be output as an intermittent pulse.

FIG. 5 illustrates the case where the microwave pulse with the specific power level is output as the microwave pulse for plasma generation. However, a microwave pulse, in which the power of the High level and the power of the Low level are periodically repeated may be output.

FIG. 5 illustrates the case where the radio-frequency pulse for bias is output as an intermittent pulse. However, the radio-frequency pulse for bias may be output as a continuous pulse.

FIG. 5 illustrates the case where the radio-frequency pulse with the specific power level is output as the radio-frequency pulse for bias. However, a radio-frequency pulse, in which the power of the High level and the power of the Low level are periodically repeated, may be output.

In the descriptions above, the powers with the two levels including the power of the High level and the power of the Low level are described. However, the power levels are not limited to two levels, and for example, powers with multiple levels such as three or more levels may be output.

In each of the embodiments above, the microwave is used as the radio frequency for plasma generation. However, the radio frequency for plasma generation is not limited to the microwave.

In each of the embodiments above, the microwave output device 16 is described as an example of the first radio-frequency power supply, and the radio-frequency power supply 58 is described as an example of the second radio-frequency power supply. However, the corresponding examples may be reversed. Specifically, the radio-frequency power supply 58 may be an example of the first radio-frequency power supply for outputting the radio-frequency pulse for bias as a continuous pulse, and the microwave output device 16 may be an example of the second radio-frequency power supply for outputting the microwave pulse for plasma generation as an intermittent pulse.

In each of the embodiments above, the analysis apparatus 100 is described as a single unit that executes the analysis program. However, the analysis apparatus 100 may be configured with multiple computers, and for example, the analysis program may be installed in each computer so that the analysis program may be executed in the form of distributed computing.

In each of the embodiments above, when installing the analysis program in the auxiliary storage device 403 of the analysis apparatus 100, for example, a method of downloading the analysis program through a network is described. At this time, a specific download source is not described, but when installing the analysis program using the downloading method, the download source may be, for example, a server device storing the analysis program in an accessible manner. Further, the server device may be a device in the cloud that accepts an access to the analysis apparatus 100 through a network and allows the download of the analysis program for fees. That is, the server device may be a device in a cloud that provides the analysis program.

The technology of the present disclosure may include the following aspects.

(Appendix 1) A plasma processing apparatus for performing a plasma processing in the manner that a first radio-frequency power supply and a second radio-frequency power supply generate pulses, respectively, and a matcher controls a load-side impedance of the second radio-frequency power supply, the plasma processing apparatus including:

a calculation unit that acquires a power of a corresponding reflected wave when the first radio-frequency power supply generates a continuous pulse, and the second radio-frequency power supply generates an intermittent pulse, based on different set parameters, and calculates an index value indicating the state of the reflected wave; and a determination unit that determines set parameters to be specified in the first radio-frequency power supply and the second radio-frequency power supply, based on a variation of each calculated index value, and derives a range to be excluded from a calculation target when the index value to be used for controlling the matcher is calculated.

(Appendix 2) The plasma processing apparatus described in Appendix 1, wherein the index value indicating the state of the reflected wave when the first radio-frequency power supply generates the continuous pulse is any one of the following:

a reflection convergence time, which is a time until a power of a reflected wave corresponding to a microwave pulse included in the continuous pulse generated by the first radio-frequency power supply reaches a predetermined value, a time range until the microwave pulse included in the continuous pulse generated by the first radio-frequency power supply is turned OFF after the power of the reflected wave corresponding to the microwave pulse included in the continuous pulse reaches the predetermined value, and an average value of powers of reflected waves in the time range until the microwave pulse included in the continuous pulse generated by the first radio-frequency power supply is turned OFF after the power of the reflected wave corresponding to the microwave pulse included in the continuous pulse reaches the predetermined value.

(Appendix 3) The plasma processing apparatus described in Appendix 1 or 2, wherein the index value indicating the state of the reflected wave when the second radio-frequency power supply generates the intermittent pulse is any one of the following:

a reflection convergence time, which is a time until a power of a reflected wave corresponding to a radio-frequency pulse included in the intermittent pulse generated by the second radio-frequency power supply becomes minimum, a time range until the radio-frequency pulse included in the intermittent pulse generated by the second radio-frequency power supply is turned OFF after the power of the reflected wave corresponding to the radio-frequency pulse included in the intermittent pulse becomes minimum, and an average value of powers of reflected waves in the time range until the radio-frequency pulse included in the intermittent pulse generated by the second radio-frequency power supply is turned OFF after the power of the reflected wave corresponding to the radio-frequency pulse included in the intermittent pulse becomes minimum.

(Appendix 4) The plasma processing apparatus described in Appendix 3, wherein the index value to be used for controlling the matcher is an average value of an index value calculated based on a power of a corresponding reflected wave when the second radio-frequency power supply generates the intermittent pulse.

(Appendix 5) The plasma processing apparatus described in Appendix 4, wherein the index value to be used for controlling the matcher is an average value of an index value calculated based on a power of a reflected wave corresponding to a pulse after a transition of the intermittent pulse generated by the second radio-frequency power supply from intermittent OFF to intermittent ON, and also corresponding to a remaining pulse excluding a pulse of the determined range.

(Appendix 6) The plasma processing apparatus described in any one of Appendixes 1 to 5, wherein the determination unit determines set parameters in which a variation of the calculated index value becomes equal to or less than a predetermined threshold value, as the set parameters to be specified in the first radio-frequency power supply and the second radio-frequency power supply.

(Appendix 7) The plasma processing apparatus described in Appendix 6, wherein the calculation unit calculates the variation of the index value each time the range to be excluded is changed, and the determination unit derives a range in which the variation of the index value calculated each time the range to be excluded is changed is equal to or less than a predetermined threshold value, as the range to be excluded from the calculation target when the index value to be used for controlling the matcher is calculated.

(Appendix 8) The plasma processing apparatus described in any one of Appendixes 1 to 7, further including:

a controller that specifies the determined set parameters in the first radio-frequency power supply and the second radio-frequency power supply, and performs the plasma processing by controlling the matcher using the index value calculated while excluding the derived range.

(Appendix 9) The plasma processing apparatus described in any one of Appendixes 1 to 8, wherein the first radio-frequency power supply generates a microwave pulse for plasma generation, and the second radio-frequency power supply generates a radio-frequency pulse for bias.

(Appendix 10) The plasma processing apparatus described in Appendix 9, wherein the set parameters specified in the first radio-frequency power supply include a microwave power, a microwave pulse frequency, and a microwave pulse duty ratio.

(Appendix 11) The plasma processing apparatus described in Appendix 9, wherein the set parameters specified in the second radio-frequency power supply include a radio-frequency power, a radio-frequency pulse frequency, a radio-frequency pulse duty ratio, a radio-frequency intermittent pulse frequency, a radio-frequency intermittent pulse duty ratio, and an offset.

(Appendix 12) The plasma processing apparatus described in any one of Appendixes 1 to 11, wherein in a first phase, the calculation unit acquires the power of the corresponding reflected wave when the first radio-frequency power supply generates the continuous pulse based on the different set parameters, and calculates the index value, the determination unit determines set parameters to be specified in the first radio-frequency power supply based on a variation of the calculated index value.

(Appendix 13) The plasma processing apparatus described in Appendix 12, wherein in a second phase, the calculation unit acquires the power of the corresponding reflected wave when the first radio-frequency power supply generates the continuous pulse based on the determined set parameters, and the second radio-frequency power supply generates the intermittent pulse based on the different set parameters, and calculates the index value, the determination unit determines set parameters to be specified in the second radio-frequency power supply based on a variation of the calculated index value, and the set parameters to be specified in the second radio-frequency power supply include a radio-frequency power, a radio-frequency pulse frequency, a radio-frequency pulse duty ratio, and an offset.

(Appendix 14) The plasma processing apparatus described in Appendix 13, wherein in a third phase, the calculation unit acquires the power of the corresponding reflected wave when the first radio-frequency power supply generates the continuous pulse based on the determined set parameters, and the second radio-frequency power supply generates the intermittent pulse based on the determined set parameters for the determined set parameters and the different set parameters for set parameters other than the determined parameters, and calculates the index value, the determination unit determines other set parameters to be specified in the second radio-frequency power supply based on a variation of the calculated index value, and derives a range to be excluded from the calculation target when the index value to be used for controlling the matcher is calculated, and the set parameters to be specified in the second radio-frequency power supply include a radio-frequency intermittent pulse frequency and a radio-frequency intermittent pulse duty ratio.

(Appendix 15) An analysis apparatus for analyzing data measured in a plasma processing apparatus that performs a plasma processing in the manner that a first radio-frequency power supply and a second radio-frequency power supply generate pulses, respectively, and a matcher controls a load-side impedance of the second radio-frequency power supply, the analysis apparatus including:

a calculation unit that acquires a power of a corresponding reflected wave when the first radio-frequency power supply generates a continuous pulse, and the second radio-frequency power supply generates an intermittent pulse, based on different set parameters, and calculates an index value indicating the state of the reflected wave; and a determination unit that determines set parameters to be specified in the first radio-frequency power supply and the second radio-frequency power supply, based on a variation of each calculated index value, and derives a range to be excluded from a calculation target when the index value to be used for controlling the matcher is calculated.

(Appendix 16) A non-transitory computer-readable storage medium having stored therein an analysis program, which causes a computer of an analysis apparatus for analyzing data measured in a plasma processing apparatus that performs a plasma processing in the manner that a first radio-frequency power supply and a second radio-frequency power supply generate pulses, respectively, and a matcher controls a load-side impedance of the second radio-frequency power supply, to perform a process including:

acquiring a power of a corresponding reflected wave when the first radio-frequency power supply generates a continuous pulse, and the second radio-frequency power supply generates an intermittent pulse, based on different set parameters, and calculating an index value indicating the state of the reflected wave; and determining set parameters to be specified in the first radio-frequency power supply and the second radio-frequency power supply, based on a variation of each calculated index value, and deriving a range to be excluded from a calculation target when the index value to be used for controlling the matcher is calculated.

It is possible to provide a plasma processing apparatus, an analysis apparatus, and an analysist program, which may stabilize a plasma processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus for performing a plasma processing in a manner that a first radio-frequency power supply and a second radio-frequency power supply generate pulses, respectively, and a matching box controls a load-side impedance of the second radio-frequency power supply, the plasma processing apparatus comprising:

a calculation circuit configured to acquire a power of a corresponding reflected wave when the first radio-frequency power supply generates a continuous pulse, and the second radio-frequency power supply generates an intermittent pulse, based on different set parameters, and calculate an index value indicating a state of the reflected wave; and a determination circuit configured to determine set parameters to be specified in the first radio-frequency power supply and the second radio-frequency power supply, based on a variation of each calculated index value, and derive a range to be excluded from a calculation target when the index value to be used for controlling the matching box is calculated.

2. The plasma processing apparatus according to claim 1, wherein the index value indicating the state of the reflected wave when the first radio-frequency power supply generates the continuous pulse is any one of the following:

a reflection convergence time, which is a time until a power of a reflected wave corresponding to a microwave pulse included in the continuous pulse generated by the first radio-frequency power supply reaches a predetermined value, a time range until the microwave pulse included in the continuous pulse generated by the first radio-frequency power supply is turned OFF after the power of the reflected wave corresponding to the microwave pulse included in the continuous pulse reaches the predetermined value, and an average value of powers of reflected waves in the time range until the microwave pulse included in the continuous pulse generated by the first radio-frequency power supply is turned OFF after the power of the reflected wave corresponding to the microwave pulse included in the continuous pulse reaches the predetermined value.

3. The plasma processing apparatus according to claim 1, wherein the index value indicating the state of the reflected wave when the second radio-frequency power supply generates the intermittent pulse is any one of the following:

a reflection convergence time, which is a time until a power of a reflected wave corresponding to a radio-frequency pulse included in the intermittent pulse generated by the second radio-frequency power supply becomes minimum, a time range until the radio-frequency pulse included in the intermittent pulse generated by the second radio-frequency power supply is turned OFF after the power of the reflected wave corresponding to the radio-frequency pulse included in the intermittent pulse becomes minimum, and an average value of powers of reflected waves in the time range until the radio-frequency pulse included in the intermittent pulse generated by the second radio-frequency power supply is turned OFF after the power of the reflected wave corresponding to the radio-frequency pulse included in the intermittent pulse becomes minimum.

4. The plasma processing apparatus according to claim 3, wherein the index value to be used for controlling the matching box is an average value of an index value calculated based on a power of a corresponding reflected wave when the second radio-frequency power supply generates the intermittent pulse.

5. The plasma processing apparatus according to claim 4, wherein the index value to be used for controlling the matching box is an average value of an index value calculated based on a power of a reflected wave corresponding to a pulse after a transition of the intermittent pulse generated by the second radio-frequency power supply from intermittent OFF to intermittent ON, and also corresponding to a remaining pulse excluding a pulse of the determined range.

6. The plasma processing apparatus according to claim 1, wherein the determination circuit determines the set parameters in which a variation of the calculated index value becomes equal to or less than a predetermined threshold value, as the set parameters to be specified in the first radio-frequency power supply and the second radio-frequency power supply.

7. The plasma processing apparatus according to claim 6, wherein the calculation circuit calculates the variation of the index value each time the range to be excluded is changed, and the determination circuit derives a range in which the variation of the index value calculated each time the range to be excluded is changed is equal to or less than a predetermined threshold value, as the range to be excluded from the calculation target when the index value to be used for controlling the matching box is calculated.

8. The plasma processing apparatus according to claim 1, further comprising:

a controller configured to specify the determined set parameters in the first radio-frequency power supply and the second radio-frequency power supply, and perform the plasma processing by controlling the matching box using the index value calculated while excluding the derived range.

9. The plasma processing apparatus according to claim 1, wherein the first radio-frequency power supply generates a microwave pulse for plasma generation, and the second radio-frequency power supply generates a radio-frequency pulse for bias.

10. The plasma processing apparatus according to claim 9, wherein the set parameters specified in the first radio-frequency power supply include a microwave power, a microwave pulse frequency, and a microwave pulse duty ratio.

11. The plasma processing apparatus according to claim 9, wherein the set parameters specified in the second radio-frequency power supply include a radio-frequency power, a radio-frequency pulse frequency, a radio-frequency pulse duty ratio, a radio-frequency intermittent pulse frequency, a radio-frequency intermittent pulse duty ratio, and an offset.

12. The plasma processing apparatus according to claim 1, wherein in a first phase, the calculation circuit acquires the power of the corresponding reflected wave when the first radio-frequency power supply generates the continuous pulse based on the different set parameters, and calculates the index value, the determination circuit determines set parameters to be specified in the first radio-frequency power supply based on a variation of the calculated index value.

13. The plasma processing apparatus according to claim 12, wherein in a second phase, the calculation circuit acquires the power of the corresponding reflected wave when the first radio-frequency power supply generates the continuous pulse based on the determined set parameters, and the second radio-frequency power supply generates the intermittent pulse based on the different set parameters, and calculates the index value, the determination circuit determines set parameters to be specified in the second radio-frequency power supply based on a variation of the calculated index value, and the set parameters to be specified in the second radio-frequency power supply include a radio-frequency power, a radio-frequency pulse frequency, a radio-frequency pulse duty ratio, and an offset.

14. The plasma processing apparatus according to claim 13, wherein in a third phase, the calculation circuit acquires the power of the corresponding reflected wave when the first radio-frequency power supply generates the continuous pulse based on the determined set parameters, and the second radio-frequency power supply generates the intermittent pulse based on the determined set parameters for the determined set parameters and the different set parameters for set parameters other than the determined parameters, and calculates the index value, the determination circuit determines other set parameters to be specified in the second radio-frequency power supply based on a variation of the calculated index value, and derives a range to be excluded from the calculation target when the index value to be used for controlling the matching box is calculated, and the set parameters to be specified in the second radio-frequency power supply include a radio-frequency intermittent pulse frequency and a radio-frequency intermittent pulse duty ratio.

15. An analysis apparatus for analyzing data measured in a plasma processing apparatus that performs a plasma processing in a manner that a first radio-frequency power supply and a second radio-frequency power supply generate pulses, respectively, and a matching box controls a load-side impedance of the second radio-frequency power supply, the analysis apparatus comprising:

a calculation circuit configured to acquire a power of a corresponding reflected wave when the first radio-frequency power supply generates a continuous pulse, and the second radio-frequency power supply generates an intermittent pulse, based on different set parameters, and calculate an index value indicating a state of the reflected wave; and a determination circuit configured to determine set parameters to be specified in the first radio-frequency power supply and the second radio-frequency power supply, based on a variation of each calculated index value, and derive a range to be excluded from a calculation target when the index value to be used for controlling the matching box is calculated.

16. A non-transitory computer-readable storage medium having stored therein an analysis program, which causes a computer of an analysis apparatus for analyzing data measured in a plasma processing apparatus that performs a plasma processing in a manner that a first radio-frequency power supply and a second radio-frequency power supply generate pulses, respectively, and a matching box controls a load-side impedance of the second radio-frequency power supply, to perform a process including:

acquiring a power of a corresponding reflected wave when the first radio-frequency power supply generates a continuous pulse, and the second radio-frequency power supply generates an intermittent pulse, based on different set parameters, and calculating an index value indicating a state of the reflected wave; and determining set parameters to be specified in the first radio-frequency power supply and the second radio-frequency power supply, based on a variation of each calculated index value, and deriving a range to be excluded from a calculation target when the index value to be used for controlling the matching box is calculated.

* * * * *